US011688689B2

(12) United States Patent
Jhothiraman et al.

(10) Patent No.: US 11,688,689 B2
(45) Date of Patent: Jun. 27, 2023

(54) ELECTRONIC DEVICES INCLUDING STAIR STEP STRUCTURES, AND RELATED MEMORY DEVICES, SYSTEMS, AND METHODS

(71) Applicant: Micron Technology, Inc., Boise, ID (US)

(72) Inventors: Jivaan Kishore Jhothiraman, Meridian, ID (US); Jiewei Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 17/313,814

(22) Filed: May 6, 2021

(65) Prior Publication Data
US 2022/0359391 A1    Nov. 10, 2022

(51) Int. Cl.
| | | |
|---|---|---|
| *H01L 23/528* | (2006.01) | |
| *H01L 23/522* | (2006.01) | |
| *H01L 21/768* | (2006.01) | |
| *H10B 41/27* | (2023.01) | |
| *H10B 43/27* | (2023.01) | |

(52) U.S. Cl.
CPC .... *H01L 23/5283* (2013.01); *H01L 21/76816* (2013.01); *H01L 21/76877* (2013.01); *H01L 23/5226* (2013.01); *H10B 41/27* (2023.02); *H10B 43/27* (2023.02)

(58) Field of Classification Search
None
See application file for complete search history.

(56) References Cited

U.S. PATENT DOCUMENTS

| | | |
|---|---|---|
| 8,836,020 B2 | 9/2014 | Lim et al. |
| 9,799,670 B2 | 10/2017 | Nishikawa et al. |
| 9,818,759 B2 | 11/2017 | Kai et al. |
| 9,905,573 B1 | 2/2018 | Mada et al. |
| 10,249,640 B2 | 4/2019 | Yu et al. |
| 10,256,245 B2 | 4/2019 | Ariyoshi |
| 10,580,795 B1 | 3/2020 | Luo et al. |
| 10,672,780 B1 | 6/2020 | Kawamura et al. |
| 10,707,231 B2 | 7/2020 | Park et al. |
| 10,741,577 B2 | 8/2020 | Lee et al. |

(Continued)

OTHER PUBLICATIONS

Luo et al., Microelectronic Devices Including Staircase Structures, and Related Memory Devices and Electronic Systems, filed Oct. 29, 2019, U.S. Appl. No. 16/667,704, 45 pages.

(Continued)

*Primary Examiner* — Hsien Ming Lee
(74) *Attorney, Agent, or Firm* — TraskBritt

(57) ABSTRACT

An electronic device comprises a stack structure comprising tiers of alternating conductive structures and insulative structures, staircase structures within the stack structure and including steps defined by edges of the tiers, contacts on the steps of the staircase structures, support pillars extending vertically through the stack structure, and support structures laterally adjacent to the contacts in a first horizontal direction and extending vertically through the stack structure. The support pillars exhibit a lateral dimension relatively larger than a lateral dimension of the contacts and the support structures. Related methods, memory devices, and systems are also described.

24 Claims, 12 Drawing Sheets

(56) References Cited

U.S. PATENT DOCUMENTS

| | | | |
|---|---|---|---|
| 10,797,071 B2 | 10/2020 | Kim et al. | |
| 10,854,513 B2 | 12/2020 | Kawasaki et al. | |
| 10,868,031 B2 | 12/2020 | Liu et al. | |
| 10,872,857 B1 | 12/2020 | Otsu et al. | |
| 10,879,264 B1 | 12/2020 | Otsu et al. | |
| 2009/0088546 A1 | 4/2009 | Ito et al. | |
| 2010/0133598 A1 | 6/2010 | Chae et al. | |
| 2010/0133599 A1 | 6/2010 | Chae et al. | |
| 2017/0179153 A1 | 6/2017 | Ogawa et al. | |
| 2017/0287926 A1* | 10/2017 | Ariyoshi | H01L 27/11582 |
| 2017/0373087 A1 | 12/2017 | Ito et al. | |
| 2018/0040623 A1 | 2/2018 | Kanakamedala et al. | |
| 2020/0035699 A1 | 1/2020 | Liu et al. | |
| 2020/0075627 A1 | 3/2020 | Ahn et al. | |
| 2020/0119031 A1 | 4/2020 | Shen et al. | |
| 2021/0043651 A1 | 2/2021 | Liu et al. | |
| 2022/0157724 A1* | 5/2022 | Takii | H01L 21/76805 |
| 2022/0270972 A1* | 8/2022 | Wang | H01L 25/18 |
| 2022/0352193 A1* | 11/2022 | Said | H01L 27/11519 |

OTHER PUBLICATIONS

Luo et al., Microelectronic Devices Including Staircase Structures, and Related Memory Devices, Electronic Systems, and Methods, filed Feb. 24, 2020, U.S. Appl. No. 16/799,543, 43 pages.

* cited by examiner

ELECTRONIC DEVICES INCLUDING STAIR STEP STRUCTURES, AND RELATED MEMORY DEVICES, SYSTEMS, AND METHODS

TECHNICAL FIELD

Embodiments disclosed herein relate to the field of electronic device design and fabrication. More particularly, embodiments of the disclosure relate to electronic devices including pillars within an array region, stair step structures within a staircase region, and support structures within one or more of the array region and the staircase region, and to related memory devices, systems, and methods.

BACKGROUND

A continuing goal of the electronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the conductive structures of the stack structure(s) of the memory device. The staircase structure includes individual "steps" defining contact regions of the conductive structures, upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the height of the stacks increases to facilitate additional memory cells in the vertical memory arrays, the stacks may be prone to toppling or collapse during various processing acts. For example, during replacement gate processing acts, the stacks may be subject to tier collapse during or after removal of portions of the tiers to be replaced with the conductive structures. Collapse of the portions of the stacks may reduce reliability of the vertical memory strings.

DETAILED DESCRIPTION

Figure 1A:
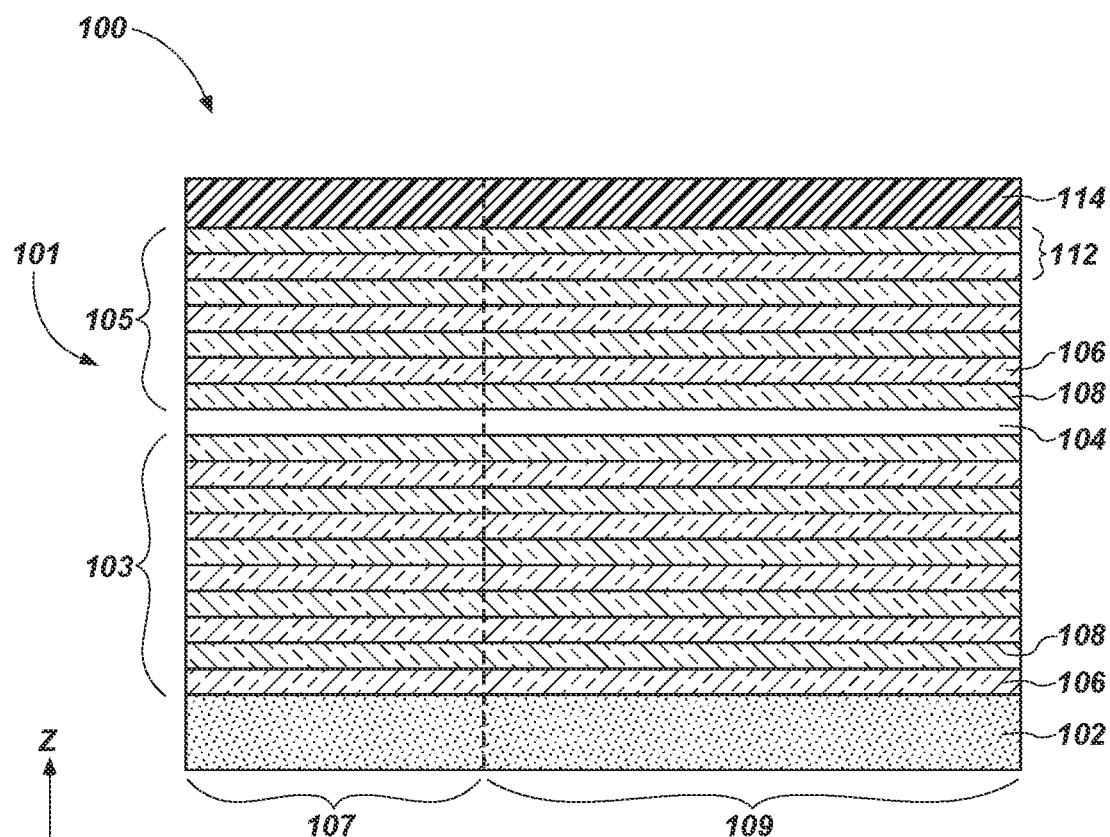
FIG. 1A through FIG. 1G are simplified cross-sectional views illustrating a method of forming an electronic device, in accordance with embodiments of the disclosure, with FIG. 1F being an enlargement of the region indicated in FIG. 1E.

An electronic device (e.g., an apparatus, a semiconductor device, a memory device) that includes one or more capacitors is disclosed. The electronic device comprises a stack structure comprising tiers of alternating conductive structures and insulative structures. Pillars (e.g., memory pillars) extend through the stack structure in an array region, and staircase structures and including steps defined by edges of the tiers are located within a staircase region of the stack structure, laterally adjacent to the array region. The electronic device includes conductive contacts on the steps of the staircase structures and support pillars extending vertically through the stack structure within the staircase region.

Support structures (e.g., support beams, which may also be characterized as columns) extend vertically through the stack structure within one or more of the array region and the staircase region. For example, the support structures may be laterally adjacent to the pillars within the array region and laterally adjacent to the conductive contacts within the staircase region. The support structures may provide increased structural support at locations horizontally proximate to filled replacement gate slots and corresponding to horizontal ends of large cantilever structures of the insulative structures within individual blocks of the stack structure. The support structures may be positioned within or proximate to regions of the stack structure that are prone to tier collapse. A lateral dimension (e.g., a width, a diameter) of the support pillars may be relatively larger than a lateral dimension of the contacts and the support structures. By providing the support structures within one or more of the array region and the staircase region, such configurations may, for example, impede undesirable tier deformations (e.g., tier warping) and/or tier collapse during the formation of the conductive structures. For example, the support structures may be formed at desired locations within a preliminary stack prior to conducting replacement gate processing acts to provide further structural support to the preliminary stack during the formation of the conductive structures. Such a configuration may prevent the risk of undesirable current leakage and short circuits during use and operation of the electronic device without significantly affecting conductivity.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional electronic device fabrication techniques employed in the industry. In addition, the description provided below does not form a complete process flow for manufacturing an electronic device (e.g., a memory device, such as 3D NAND Flash memory device). The structures described below do not form a complete electronic device. Only those process acts and structures necessary to understand the embodiments of the disclosure are described in detail below. Additional acts to form a complete electronic device from the structures may be performed by conventional fabrication techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "configured" refers to a size, shape, material composition, and arrangement of one or more of at least one structure and at least one apparatus facilitating operation of one or more of the structure and the apparatus in a pre-determined way.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), an electronic device combining logic and memory, or a graphics processing unit (GPU) incorporating memory.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "conductive material" means and includes an electrically conductive material. The conductive material may include one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon.

As used herein, a "conductive structure" means and includes a structure formed of and including one or more conductive materials.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, an "insulative structure" means and includes a structure formed of and including an insulative material.

As used herein, the term "low-k dielectric material" means and includes a dielectric material, such as a dielectric oxide material, having a dielectric constant lower than the dielectric constant of a silicon oxide ($SiO_x$, $SiO_2$) material or of a carbon-doped silicon oxide material that includes silicon atoms, carbon atoms, oxygen atoms, and hydrogen atoms. The dielectric constant of silicon dioxide is from about 3.7 to about 3.9. The term "low-k dielectric material" is a relative term and is distinguished from the term "dielectric material" by a relative value of its dielectric constant.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the terms "stair step" structure and "staircase" structure are used interchangeably.

Figure 1B:
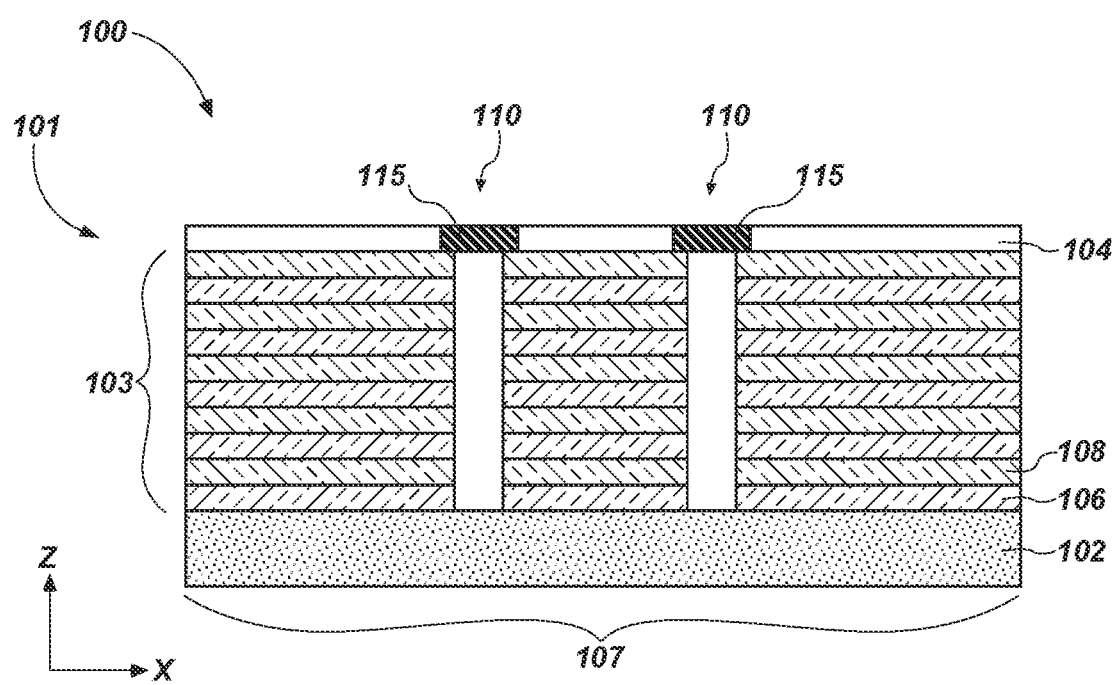
Figure 1C:
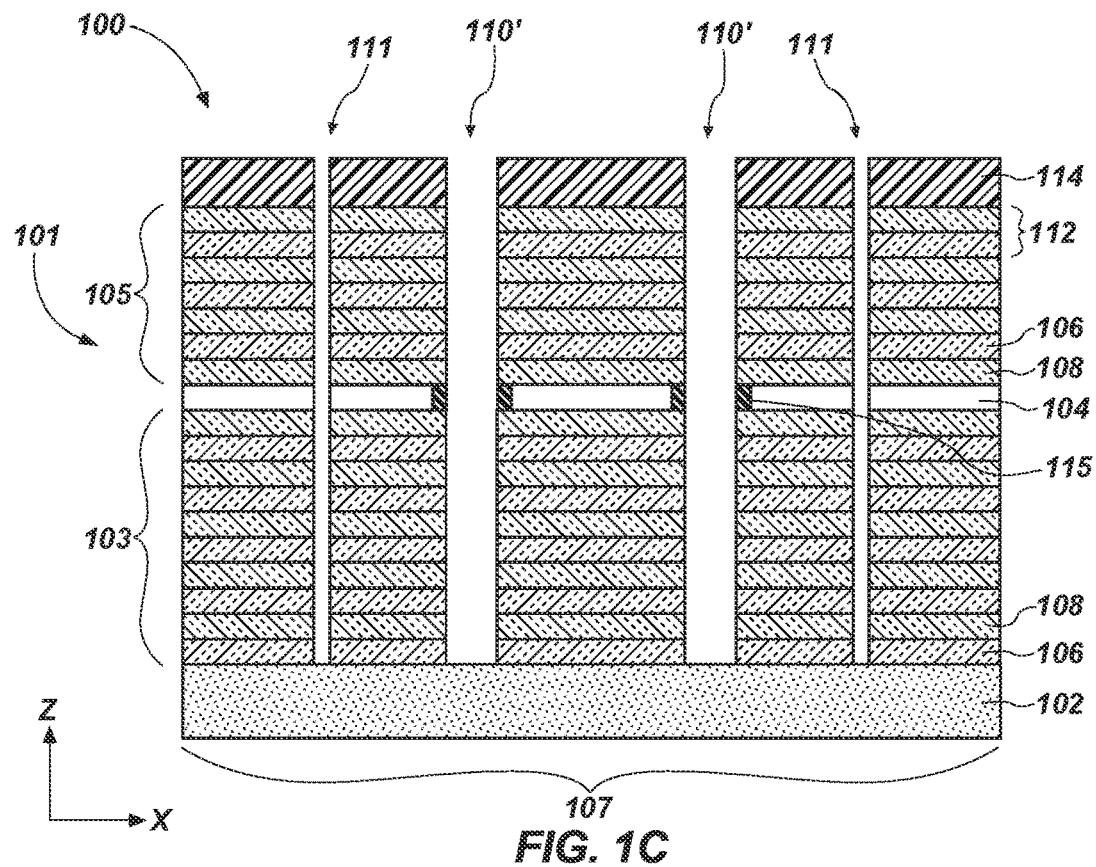
Figure 1D:
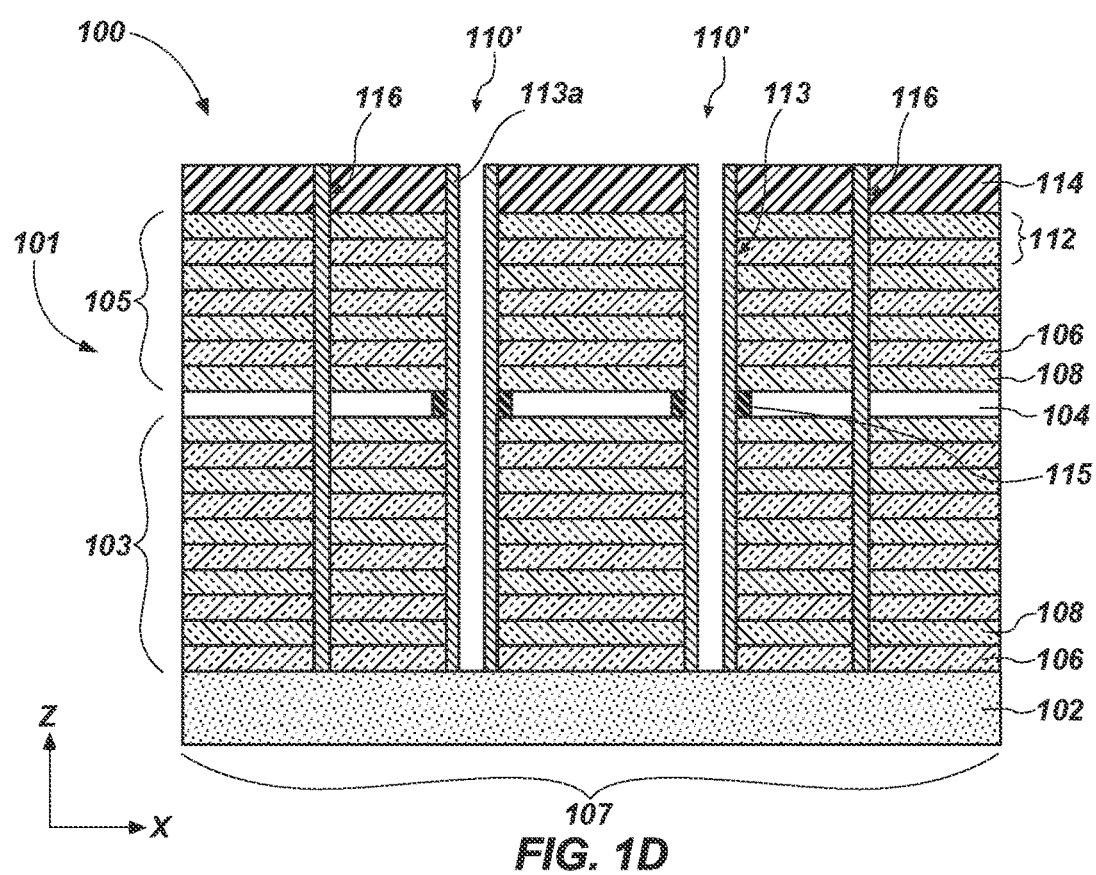
Figure 1E:
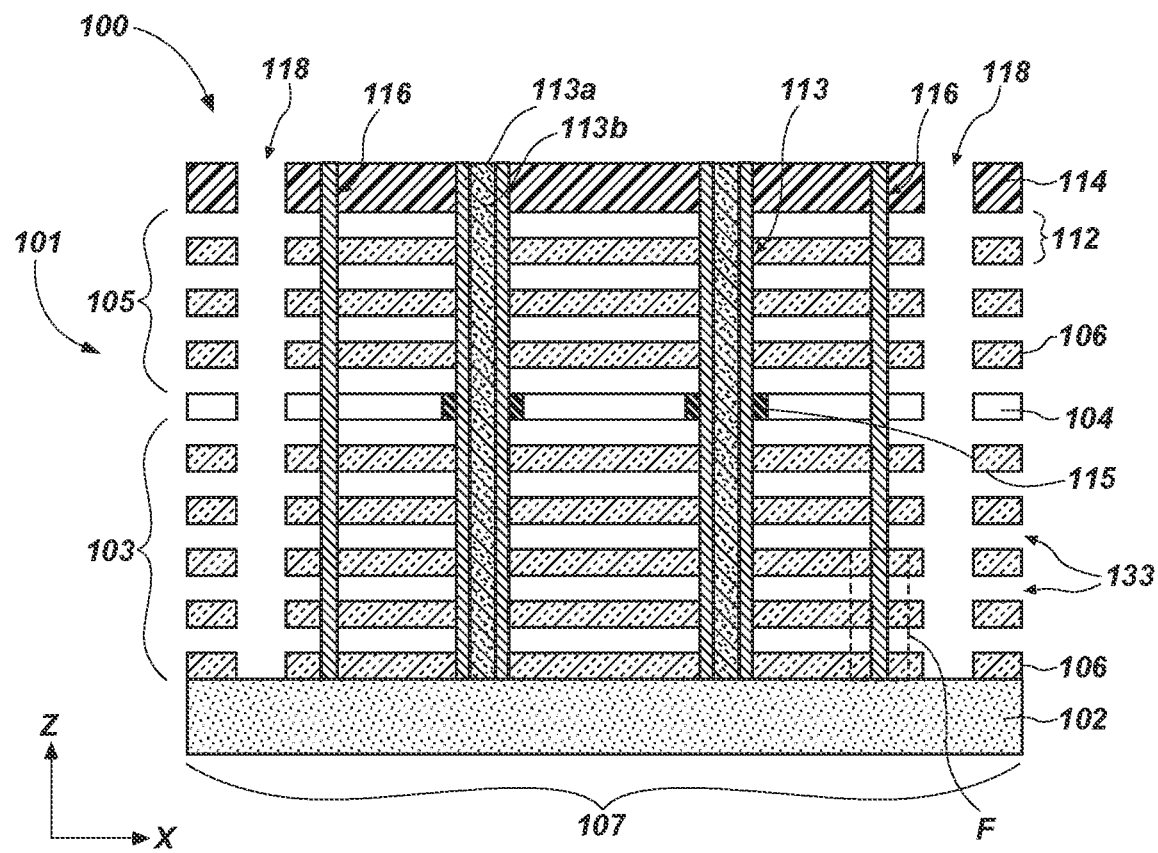
Figure 1F:
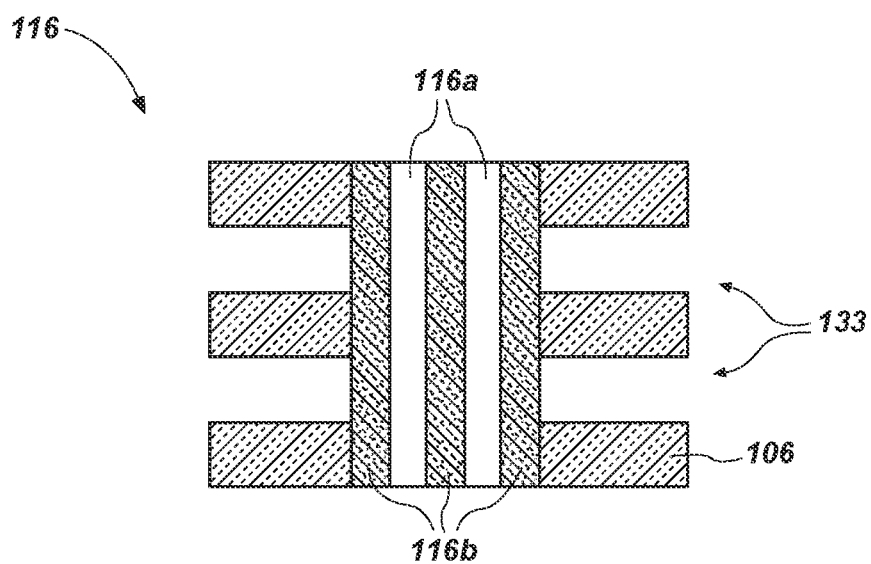
Figure 1G:
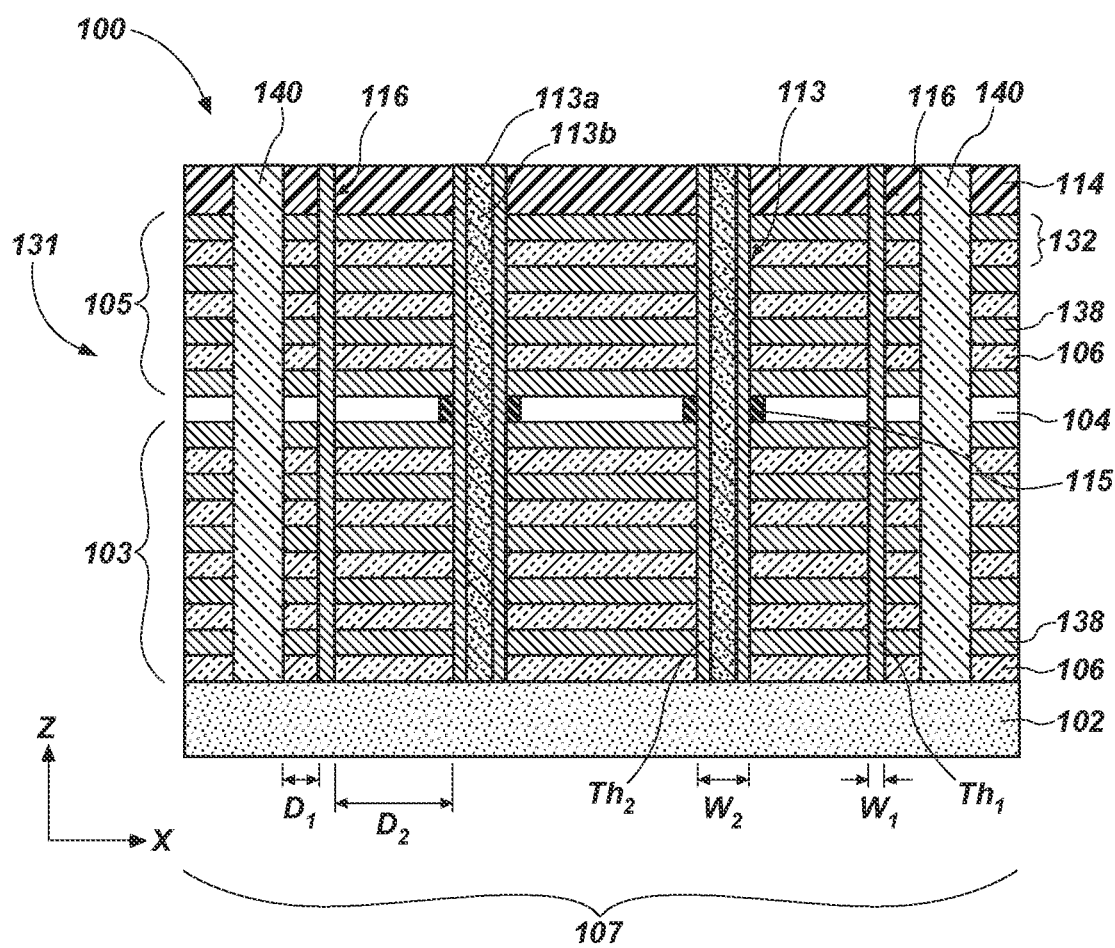
Figure 2A:
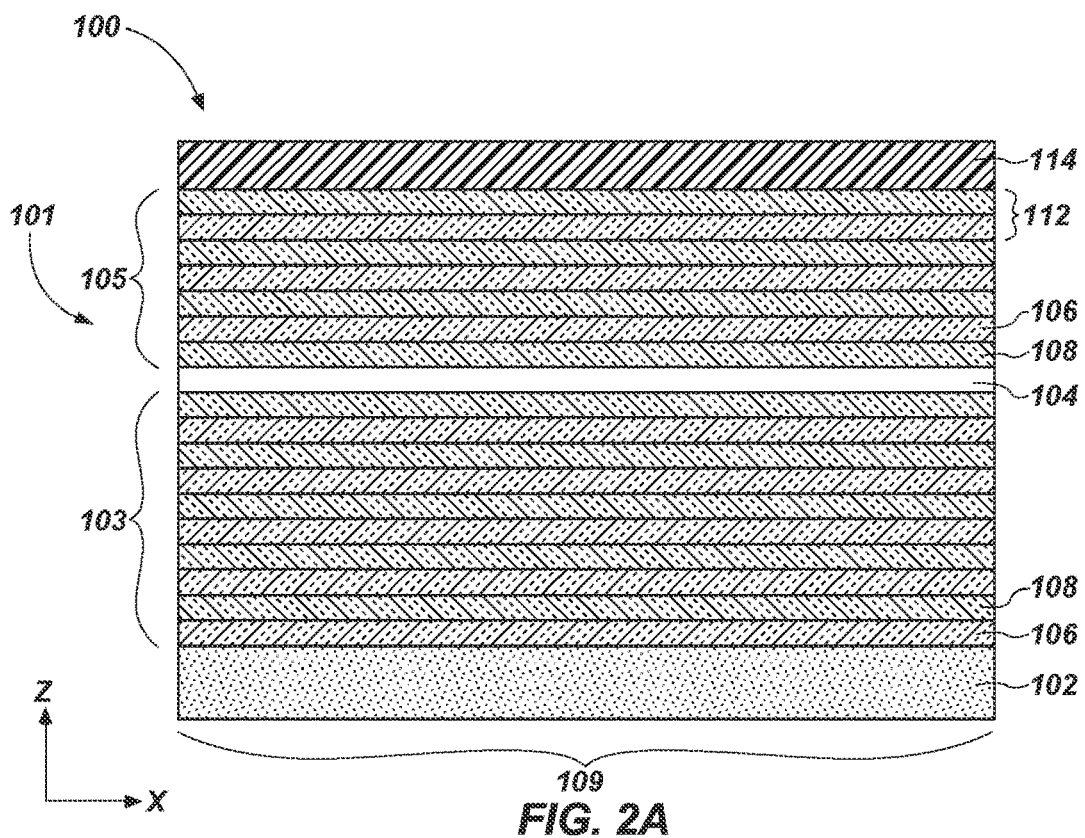
FIG. 2A through FIG. 2G are simplified cross-sectional views illustrating a method of forming the electronic device, in accordance with embodiments of the disclosure.
Figure 2B:
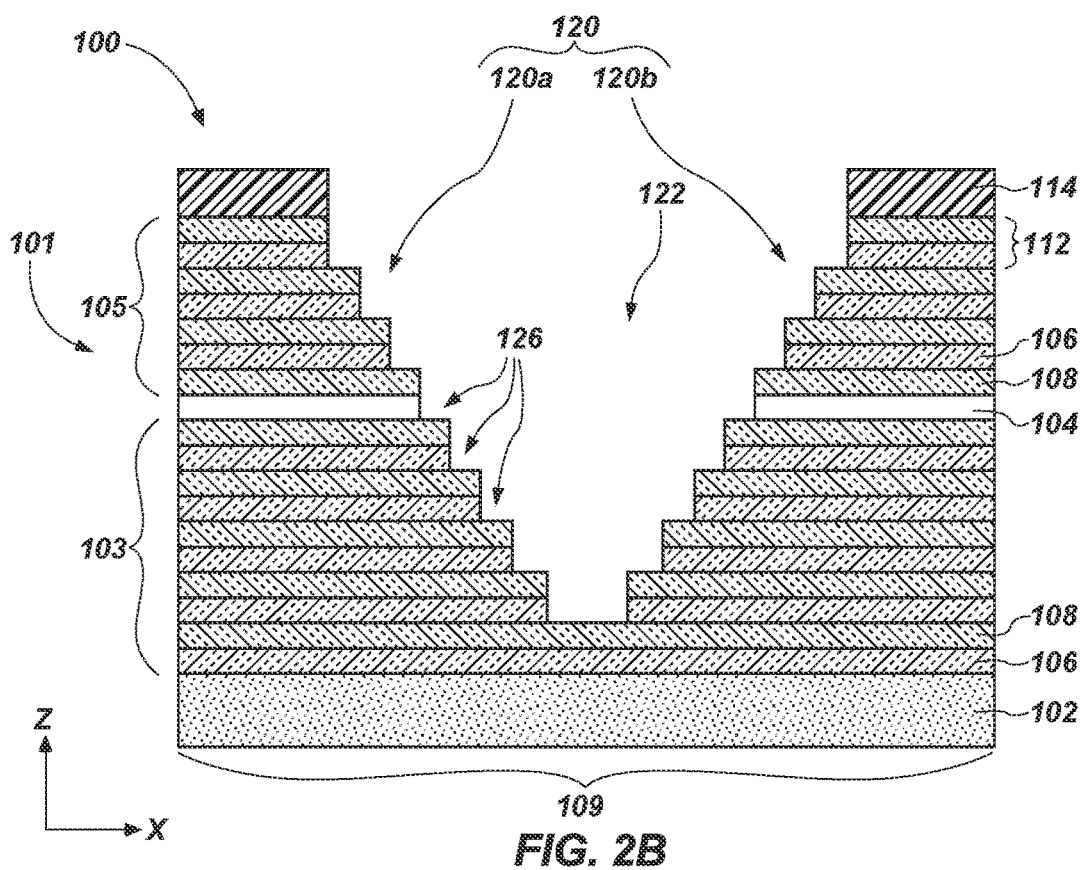
Figure 2C:
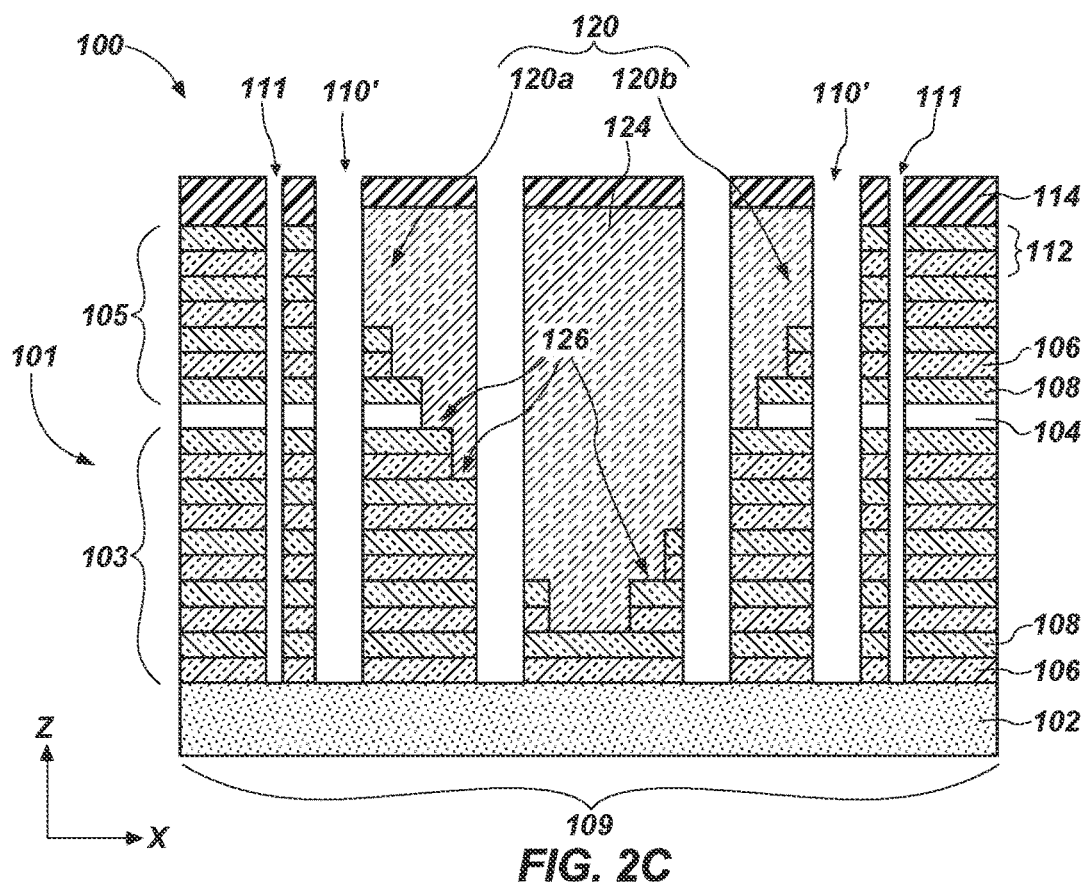
Figure 2D:
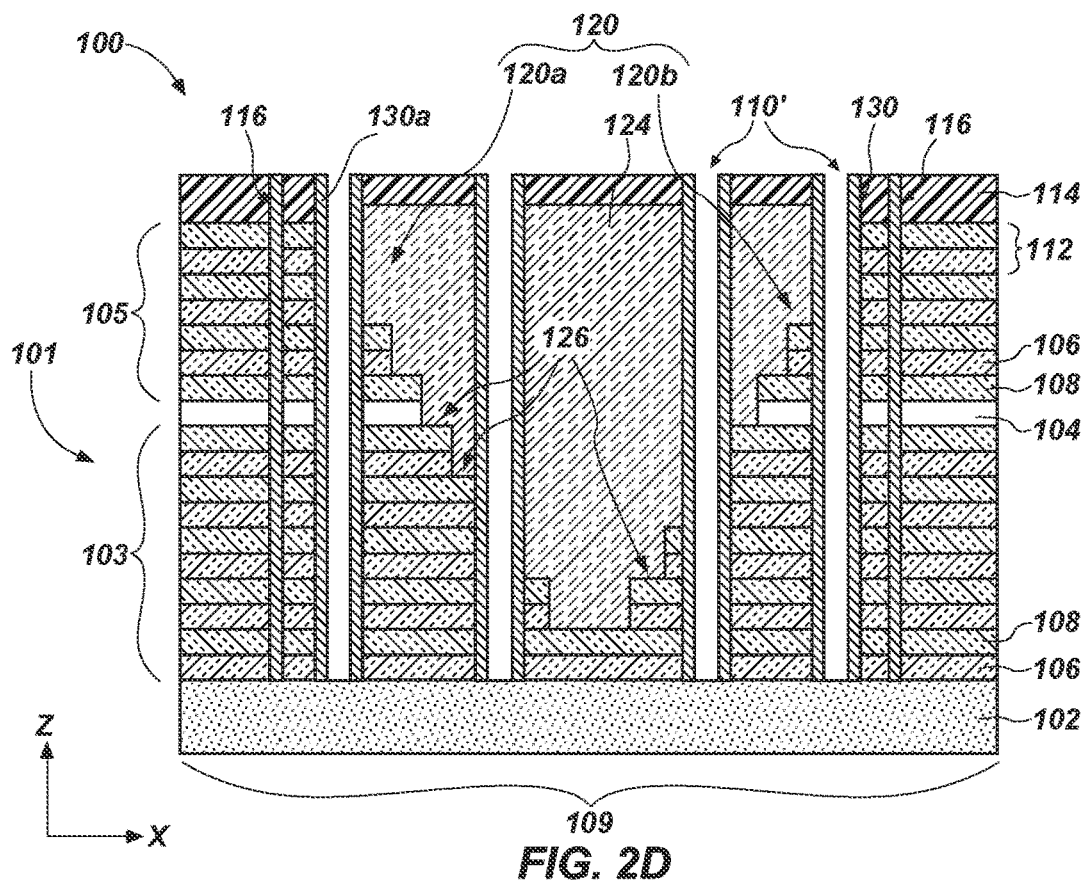
Figure 2E:
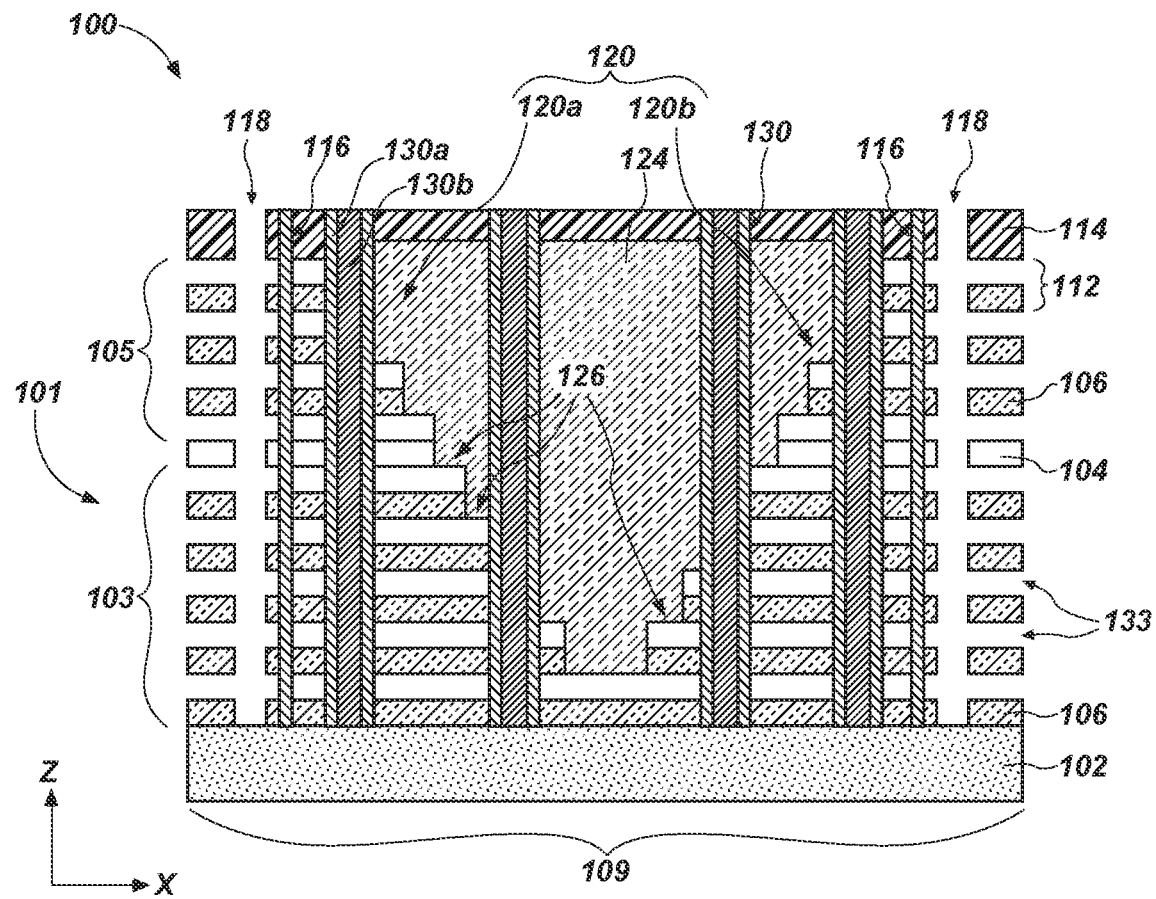
Figure 2F:
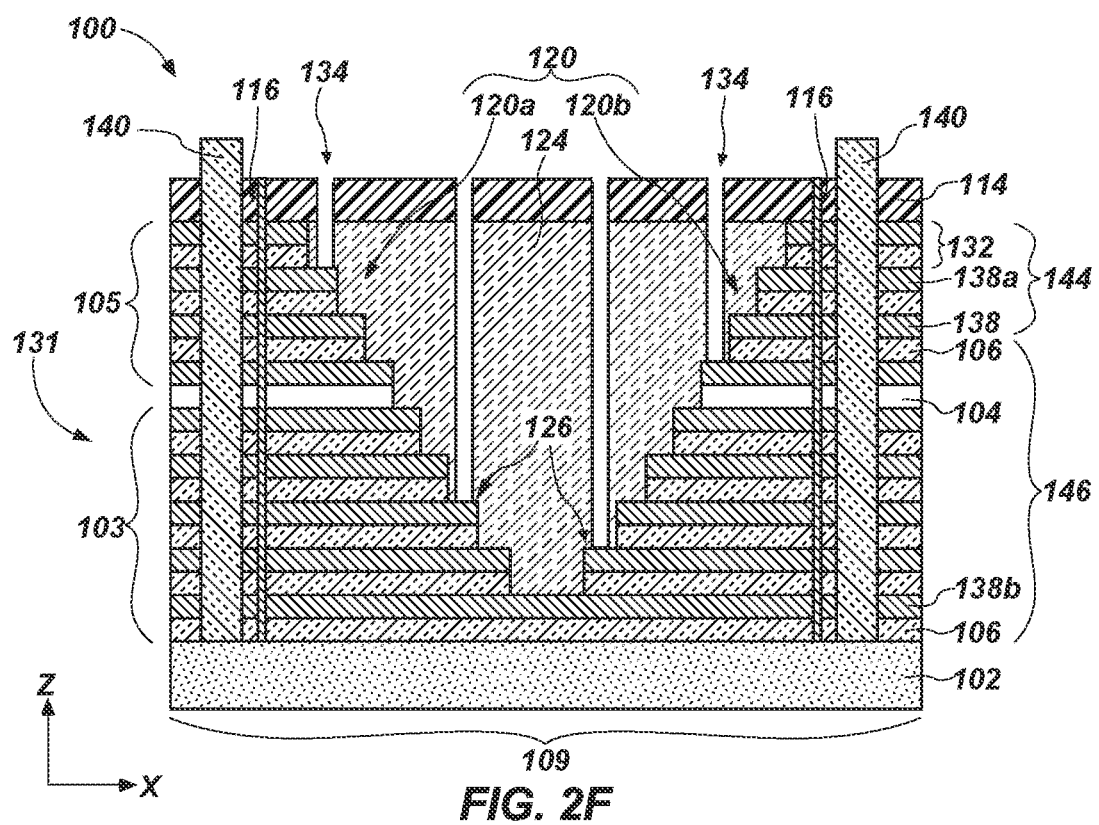
Figure 2G:
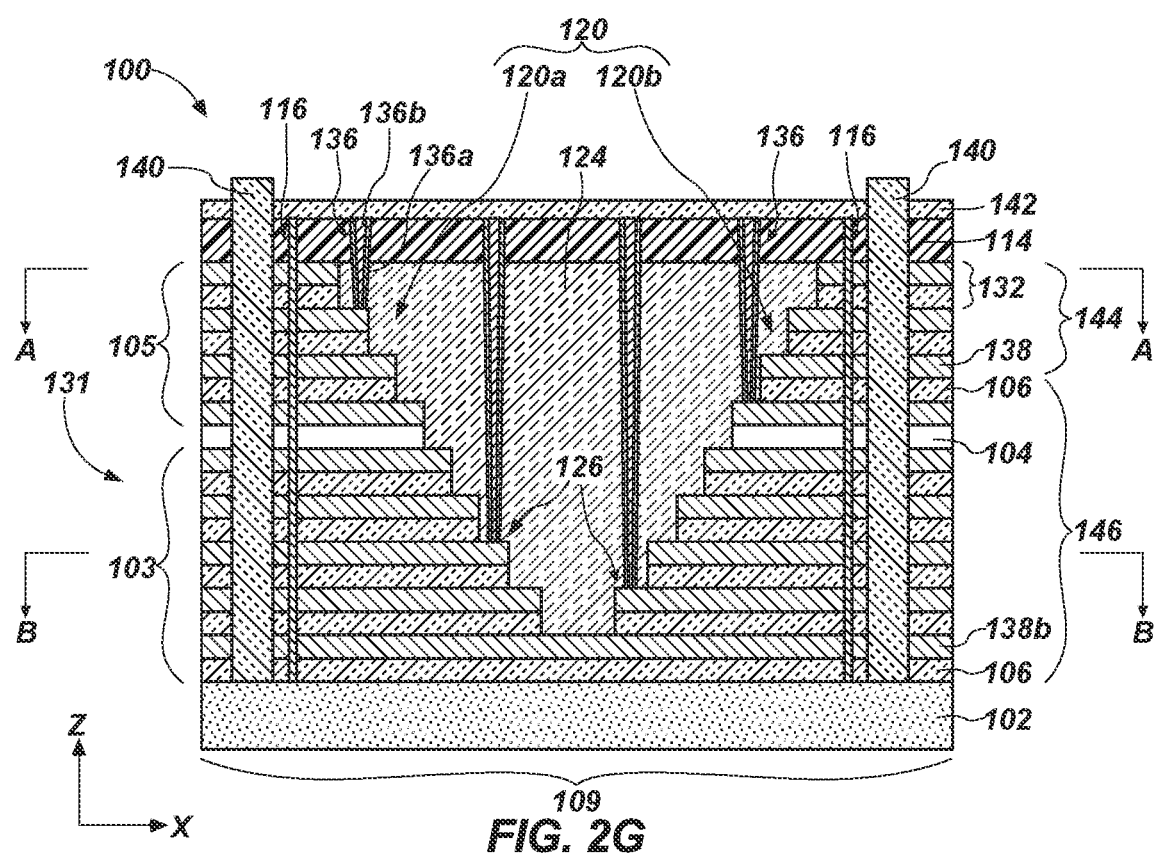
Figure 3A:
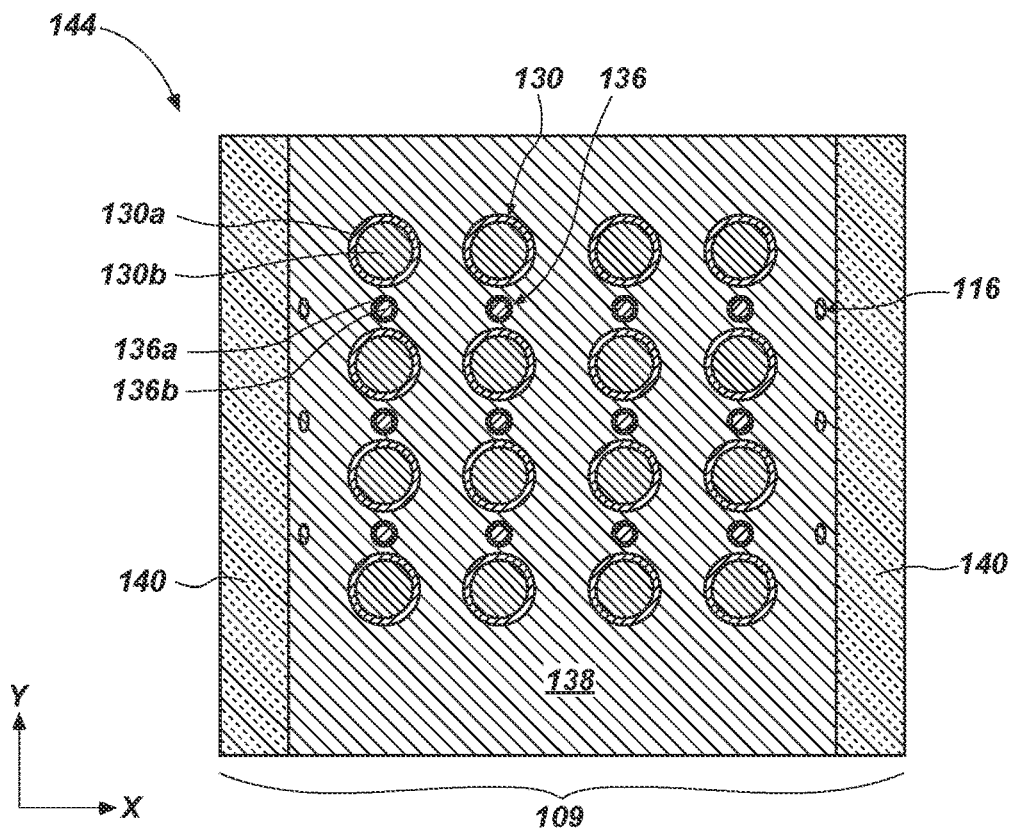
FIG. 3A and FIG. 3B are simplified top down views illustrating the electronic device, in accordance with embodiments of the disclosure, where the top down views of FIGS. 3A and 3B are taken along the A-A line and the B-B line, respectively, in FIG. 2G.
Figure 3B:
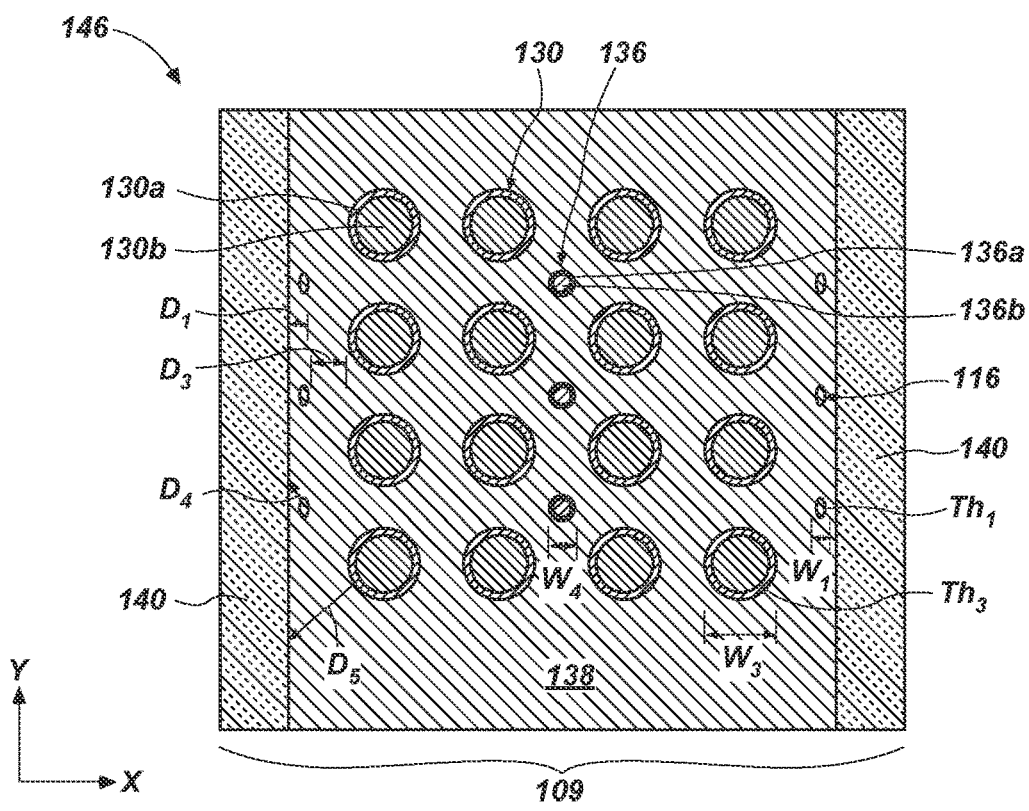

FIG. 1A through FIG. 3B illustrate a method of forming an electronic device (e.g., a memory device, such as a 3D NAND Flash memory device), in accordance with embodiments of the disclosure, of which FIG. 1F is an enlargement of the portion of FIG. 1E indicated by the dashed line of box F, and FIGS. 3A and 3B are simplified partial top down views of a portion of FIG. 2G. Referring to FIG. 1A, an electronic device 100 may be formed to include a stack 101 (e.g., a preliminary stack) including a vertically (e.g., in the Z-direction) alternating sequence of insulative structures 106 and additional insulative structures 108 arranged in tiers 112. Each of the tiers 112 may include at least one of the insulative structures 106 directly vertically adjacent at least one of the additional insulative structures 108. For convenience in describing FIGS. 1A through 1G, a first direction may be defined as the X-direction and a second direction, which is transverse (e.g., perpendicular) to the first direction, as the Y-direction. A third direction, which is transverse (e.g., perpendicular) to each of the first direction and the second direction, may be defined as the Z-direction. Similar directions are defined, as shown in FIGS. 2A through 3B, as discussed in greater detail below.

A number (e.g., quantity) of tiers 112 of the stack 101 may be within a range from about 32 of the tiers 112 to about 256 of the tiers 112. In some embodiments, the stack 101 includes about 128 of the tiers 112. However, the disclosure is not so limited, and the stack 101 may include a different number of the tiers 112. The stack 101 may comprise at least one (e.g., one, two, more than two) deck structure vertically overlying a source 102. For example, the stack 101 may comprise a single deck structure (not shown) or a dual deck structure for a 3D memory device (e.g., a 3D NAND Flash memory device). The stack 101 may include a first deck 103 (e.g., a lower deck) and a second deck 105 (e.g., an upper deck) separated from the first deck 103 by an insulative material 104, which may also be referred to herein as an inter-deck oxide. The insulative material 104 may comprise an oxide material such as, for example, silicon dioxide, aluminum oxide, or another material. In some embodiments, the insulative material 104 has a different material composition than the material composition of the insulative structures 106 and the additional insulative structures 108. In other embodiments, the insulative material 104 has substantially the same material composition as the insulative structures 106.

The insulative structures 106 may be formed of and include, for example, at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$). In some embodiments, the insulative structures 106 are formed of and include $SiO_2$.

The additional insulative structures 108 may be formed of and include an insulative material that is different than, and exhibits an etch selectivity with respect to, the insulative structures 106. The additional insulative structures 108 may be formed of and include at least one dielectric nitride material (e.g., $SiN_y$) or at least one oxynitride material (e.g., $SiO_xN_y$). In some embodiments, the additional insulative structures 108 are formed of and include $Si_3N_4$.

The stack 101 may be formed on or over the source 102 (e.g., a source tier, a source plate). The source 102 may be formed of and include a conductive material such as, for example, a semiconductor material (e.g., polysilicon) doped with at least one p-type dopant (e.g., one or more of boron, aluminum, and gallium) or at least one n-type dopant (e.g., arsenic, phosphorous, antimony).

A lowermost one of the insulative structures 106 may be located adjacent the source 102. As will be described herein, during fabrication of electronic device 100, one or more portions of the additional insulative structures 108 may be replaced to form conductive structures, such as select gate structures, which may comprise one or more select gate drain (SGD) structures, and an additional select gate structure, which may comprise a select gate source (SGS) structure.

An upper insulative material 114, which may serve as a mask material, may overlie an uppermost tier 112 of the stack 101. The upper insulative material 114 may exhibit an etch selectivity relative to the insulative structures 106 and the additional insulative structures 108. The upper insulative material 114 may include, by way of non-limiting example, one or more of polysilicon, a dielectric material, a nitride material (e.g., silicon nitride), a metal oxide (e.g., aluminum oxide, titanium oxide, tantalum oxide, tungsten oxide). In some embodiments, the upper insulative material 114 comprises polysilicon.

The electronic device 100 includes an array region 107 (e.g., a memory array region) and a staircase region 109 horizontally neighboring (e.g., in the X-direction) the array region 107. As described in further detail below, the electronic device 100 further includes additional components (e.g., features, structures, devices) within boundaries of the different horizontal regions. For ease of understanding the disclosure, formation of the array region 107 is illustrated in FIG. 1B through FIG. 1G, and formation of the staircase region 109 is illustrated in FIG. 2A through FIG. 2G. However, one of ordinary skill in the art will recognize and appreciate that the staircase region 109 may be formed during (e.g., substantially simultaneous with) formation of the array region 107.

Referring to FIG. 1B, following formation of the first deck 103 and the insulative material 104 of the stack 101, and prior to formation of the second deck 105 (FIG. 1A), openings 110 may be formed within the array region 107 of the electronic device 100. Plugs 115 may be formed at upper vertical boundaries (e.g., in the Z-direction) of the openings 110 to substantially fill (e.g., plug, cover) an upper portion of the openings 110. As shown in FIG. 1B, the openings 110 may extend vertically through the insulative material 104 and portions of the stack 101 vertically underlying the insulative material 104 to the source 102. Lower vertical boundaries of the openings 110 may be defined by an upper surface of the source 102, and horizontal boundaries of the openings 110 may be defined by surfaces (e.g., side surfaces) of the stack 101 (e.g., surfaces of the insulative structures 106 and the additional insulative structures 108 of the tiers 112) and the insulative material 104. The openings 110 may subsequently be filled with material to form pillars within the array region 107 of the electronic device 100, as described in further detail below.

The openings 110 may have any suitable transverse cross-sectional shape such as, for example, a substantially circular cross-sectional shape, a substantially square cross-sectional shape, a substantially elliptical cross-sectional shape, or a substantially triangular cross-sectional shape. In some embodiments, each of the openings 110 may individually exhibit a substantially circular cross-sectional shape having a substantially circular cross-sectional area. While two openings 110 are shown in FIG. 1B for clarity, any number of openings 110 may be formed in a repeating pattern within the array region 107 of the electronic device 100.

As shown in FIG. 1B, the plugs 115 may be formed to extend vertically (e.g., in the Z-direction) into the insulative material 104 and may cover the openings 110. The plugs 115 may be configured and positioned to protect the openings 110 from being filled with material during additional processing acts to form the second deck 105 (FIG. 1A) over the stack 101, as described in further detail below. Each of the plugs 115 may be at least partially (e.g., substantially) horizontally aligned (e.g., in the X-direction and in the Y-direction) with one of the openings 110 vertically thereunder. The plugs 115 may be confined within vertical boundaries of the insulative material 104. For example, the plugs 115 may not extend into portions of the first deck 103 of the stack 101 underlying the insulative material 104. Horizontal boundaries of the plugs 115 may be defined by side surfaces of the insulative material 104.

The plugs 115 may individually be formed to exhibit a desired size and shape to cover (e.g., plug, enclose) at least one of the openings 110. In some embodiments, each of the plugs 115 is individually formed to exhibit a transverse cross-sectional shape (e.g., a substantially circular cross-sectional shape, a substantially square cross-sectional shape, a substantially elliptical cross-sectional shape, or a substantially triangular cross-sectional shape), and is sized and positioned to cover a single (e.g., only one) opening 110. For example, the plugs 115 may exhibit a substantially circular cross-sectional shape having a substantially circular cross-sectional area sized and positioned to completely fill a cross-sectional area of the opening 110. As shown in FIG. 1B, the plugs 115 may extend beyond horizontal boundaries of the openings 110. In other embodiments, the plugs 115 may exhibit one or more of a different size and shape so long as the plugs 115 cover the openings 110.

The plugs 115 may be formed of and include at least one material able to bridge adjacent portions of the first deck 103, and able to protect a lower portion of the opening 110 within the stack 101 from being filled with material during additional processing acts to form the second deck 105 (FIG. 1A) over the first deck 103 of the stack 101. The material of the plugs 115 may be selectively etchable relative to one or more of the insulative material 104, the insulative structures 106, the additional insulative structures 108, and the upper insulative material 114 (FIG. 1A). The plugs 115 may, for example, comprise one or more of at least one semiconductive material (e.g., a silicon material, such as polysilicon), at least one conductive material, and at least one dielectric material (e.g., one or more of a dielectric oxide, a dielectric nitride, a dielectric oxynitride, and a dielectric carboxynitride). In some embodiments, the plugs 115 are formed of and include polysilicon. In additional embodiments, the plugs 115 are formed of and include tungsten (W). In further embodiments, the plugs 115 are formed of and include titanium nitride (TiN).

The plugs 115 may be formed using conventional processes, which are not described in detail herein. By way of non-limiting example, following the formation of the openings 110, the insulative material 104 may be subjected to an etching process to expand (e.g., increase) horizontal dimensions of upper portions of the openings 110 vertically positioned within the insulative material 104. A plug material may be formed by a non-conformal process inside and outside of the horizontally expanded, upper portions of the openings 110, and may bridge adjacent portions of the first deck 103 of the stack 101 and close off the openings 110 without extending vertically into and filling portions of the openings 110 vertically below the insulative material 104. Portions of the plug material overlying upper vertical boundaries of the insulative material 104 may be removed (e.g., by way of a planarization process, such as a CMP process) to form the plugs 115.

Referring to FIG. 1C, the second deck 105 may be formed on or over the first deck 103 of the stack 101, the insulative material 104, and the plugs 115. The second deck 105 may include a vertically alternating sequence of the insulative structures 106 and the additional insulative structures 108 arranged in the tiers 112, and the upper insulative material 114 may be formed on or over the second deck 105. A number (e.g., quantity) of the tiers 112 of the second deck 105 may be equal to (e.g., the same as) a number of the tiers 112 of the first deck 103, or a quantity of the tiers 112 of the second deck 105 may be different than (e.g., less than, greater than) a quantity of the tiers 112 of the first deck 103. In other embodiments, the stack 101 includes a single deck (not shown) extending between the source 102 and the upper insulative material 114. In some such embodiments, the single deck may be formed without forming the insulative material 104 or the plugs 115.

As shown in FIG. 1C, upper portions of the openings 110 may be formed to extend vertically through the upper insulative material 114 and the second deck 105 of the stack 101 to expose upper surfaces of the plugs 115. Portions of the plug material of the plugs 115 may be selectively removed (e.g., exhumed) to expose respective lower portions of the openings 110 and to form extended openings 110' (e.g., pillar openings) extending vertically through each of the first deck 103 and the second deck 105 of the stack 101. Additional openings 111 may be formed laterally adjacent to the extended openings 110'. The additional openings 111 extend vertically through each of the first deck 103 and the second deck 105 of the stack 101 and exhibit a height substantially similar to (e.g., the same as) a height of the extended openings 110'. The additional openings 111 may be formed during the same material removal act used to form the extended openings 110' or, alternatively, using one or more additional material removal acts. For example, the additional openings 111 may be formed during formation of the extended openings 110' using a single (e.g., one) masking act to reduce cost and the number of process acts conducted. The additional openings 111 may have any suitable transverse cross-sectional shape such as, for example, a substantially circular cross-sectional shape, a substantially square cross-sectional shape, a substantially elliptical cross-sectional shape, or a substantially triangular cross-sectional shape. The cross-sectional shape of support structures 116 (see FIG. 1D) subsequently formed in the additional openings 111 may be tailored to provide sufficient mechanical support to the electronic device 100 without conductivity loss of the electronic device 100. In some embodiments, each of the additional openings 111 may individually exhibit a substantially circular cross-sectional shape having a substantially circular cross-sectional area. In other embodiments, at least some of the additional openings 111 may individually exhibit an elongate cross-sectional shape, such as an oblong cross-sectional shape. While two additional openings 111 are shown in FIG. 1C for clarity, any number of the additional openings 111 may be formed laterally adjacent to the extended openings 110' within the array region 107 of the electronic device 100. A lateral dimension (e.g., a diameter) of the extended openings 110' may be relatively larger than a lateral dimension of the additional openings 111.

Lower vertical boundaries of the extended openings 110' and the additional openings 111 may be defined by the upper surface of the source 102. Horizontal boundaries of the extended openings 110' and the additional openings 111 may be defined by surfaces (e.g., side surfaces) of each of the first deck 103 and the second deck 105 of the stack 101 (e.g., surfaces of the insulative structures 106 and the additional insulative structures 108 of the tiers 112), the upper insulative material 114, and remaining portions of the plug material of the plugs 115. The extended openings 110' and the additional openings 111 may be configured (e.g., sized and shaped) to receive subsequently formed structures, as shown in FIGS. 1D and 1E. The additional openings 111 may be formed around a perimeter (e.g., near lateral edges) of the array region 107 without being formed between neighboring extended openings 110'. For example, the additional openings 111 may be formed proximate to areas designated for subsequently formed slots (e.g., replacement gate slots), as described in greater detail below. Additionally, or alternatively, at least some of the additional openings 111 may be formed within central regions of individual blocks of the stack 101. For example, the additional openings 111 may be formed in one or more rows along a midline centrally located between areas designated for the slots, without being formed to surround individual extended openings 110'.

Referring to FIG. 1D, a cell film 113a of pillars 113 (e.g., memory pillars) may be formed (e.g., conformally formed) within the extended openings 110'. The cell film 113a may include a cell material formed within the extended openings 110', and a channel material formed adjacent (e.g., over) the cell material. For convenience, the cell material and channel material are illustrated as a single material (e.g., the cell film 113a) in FIG. 1D. However, the cell film 113a is understood to include both the cell material and the channel material. In some embodiments, the channel material of cell film 113a comprises a liner having a thickness less than about 25 nanometers (nm), such as within a range of from about 5 nm to about 20 nm. The cell material and channel material are formed by conventional techniques, such as by CVD or ALD. In some embodiments, the cell material is formed by plasma enhanced ALD (PEALD). The cell material may, for example, be an oxide-nitride-oxide (ONO) material, such as a silicon oxide-silicon nitride-silicon oxide material, that is conformally formed on or over sidewalls of the pillars 113. The channel material may be conformally formed adjacent (e.g., over) the cell material. The channel material may, for example, be polysilicon.

As shown in FIG. 1D, support structures 116 (e.g., support beams) may be formed (e.g., conformally formed) within the additional openings 111 (FIG. 1C). The support structures 116 include one or more materials (e.g., insulative materials) within the array region 107 such that the support structures 116 function as mechanical support structures positioned within selected regions of the stack 101 to provide uniform support when the stack 101 includes a large number of the tiers 112. In other words, the support structures 116 may be positioned within or proximate to regions of the stack 101 that are prone to tier collapse. The support structures 116 may be positioned laterally adjacent to an area designated for the pillars 113. For example, the support structures 116 may extend along one or more (e.g., two) peripheral edges of individual arrays of the pillars 113 within the array region 107. The support structures 116 may be substantially devoid of a conductive material and may exhibit one or more of the following properties: negligible conductivity, resistance to oxidation, and higher hardness or Young's modulus relative to a conductive material. The mechanical strength provided by the support structures 116 may reduce or prevent tier collapse and/or deformation in the stack 101. The support structures 116 are formed by conventional techniques, such as by CVD or ALD. In some embodiments, the support structures 116 are formed by plasma enhanced ALD (PEALD). By conformally forming the insulative material of the support structures 116 in the additional openings 111, voids in the support structures 116 may be substantially reduced (e.g., minimized). Accordingly, the material of the support structures 116 may be formed within lowermost portions of the additional openings 111 in order to provide the mechanical support at the bottom of the stack 101 (e.g., within the first deck 103 proximate to the source 102). The support structures 116 may be formed of and include at least one insulative material. A material of the support structures 116 may be substantially homogeneous, or may be heterogeneous. The support structures 116 may be continuous along a vertical distance of the stack 101, including the first deck 103 and the second deck 105. As used herein, the term "continuous" means and includes a material having substantially no interruptions, such as voids, gaps, pinholes, or other openings, therein. In some embodiments, the support structures 116 include a single high quality silicon oxide material, such as an ALD $SiO_x$. For example, the material of the support structures 116 may be a highly uniform and highly conformal silicon oxide material (e.g., a highly uniform and highly conformal silicon dioxide material) so that substantially no voids are present in the support structures 116. In particular, the support structures 116 may be formulated to be formed in high aspect ratio (HAR) openings, such as those having a HAR of at least about 20:1, at least about 50:1, at least about 100:1, or at least about 1000:1, without forming voids. The material of the support structures 116 may, alternatively, be formed of and include one or more of silicon oxycarbide ($SiO_xC_y$), silicon oxynitride ($SiO_xN_y$), hydrogenated silicon oxycarbide ($SiC_xO_yH_z$), or silicon oxycarbonitride ($SiO_xC_yN_z$). The material of the support structures 116 may include a low-k dielectric material, such as a dielectric nitride material or a dielectric oxide material, having a dielectric constant (k) lower than the dielectric constant of a silicon nitride ($Si_3N_4$) material, of a silicon oxide ($SiO_x$, $SiO_2$) material, or of a carbon-doped silicon oxide material that includes silicon atoms, carbon atoms, oxygen atoms, and hydrogen atoms. In other embodiments, the material of the support structures 116 may include another metal oxide, such as zirconium oxide ($ZrO_x$), tantalum oxide ($TaO_x$), or magnesium oxide ($MgO_x$), for example.

The support structures 116 may, alternatively, include a heterogeneous configuration including a nitride material (e.g., silicon nitride) substantially laterally surrounded by an oxide material (e.g., silicon dioxide). In other embodiments, the support structures 116 include an oxide-nitride-oxide (ONO) material, such as a silicon oxide-silicon nitride-silicon oxide material, as described in greater detail with reference to FIG. 1F. In some embodiments, the material of the support structures 116 within the array region 107 has substantially the same material composition as the cell material of the cell film 113a of the pillars 113 (e.g., an ONO material). In such embodiments, the support structures 116 may be formed at substantially the same time as the cell material of the cell film 113a of the pillars 113, resulting in a thickness of the support structures 116 and the cell film 113a being substantially the same. In other words, the support structures 116 may be configured (e.g., sized and shaped) to be substantially the same as the cell material of the cell film 113a and may be formed during formation thereof. By forming the support structures 116 during formation of the cell material of the cell film 113a of the pillars 113, manufacturing costs may be reduced.

Referring to FIG. 1E, a fill material 113b of the pillars 113 may be formed adjacent (e.g., over) the channel material of the cell film 113a, substantially filling the extended openings 110' (FIG. 1D). The fill material 113b may be an insulative material, such as a silicon oxide material. For example, the fill material 113b may be a substantially uniform and conformal silicon oxide ($SiO_x$) material (e.g., a substantially uniform and conformal $SiO_2$ material). The fill material 113b may be substantially uniform and conformal as deposited. The fill material 113b may be formed by conventional techniques, such as by ALD. In some embodiments, the fill material 113b is an ALD $SiO_x$. The fill material 113b may initially be formed in the extended openings 110' and over exposed horizontal surfaces of the stack 101, with the fill material 113b over the stack 101 subsequently removed, such as by an abrasive planarization process (e.g., chemical mechanical planarization (CMP)). Accordingly, the fill material 113b is surrounded by the cell material and the channel material of the cell film 113a in the extended openings 110'.

The fill material 113b of the pillars 113 may be formed to substantially fill remaining portions of the extended openings 110' (FIG. 1D) extending vertically through the first deck 103 and the second deck 105 of the stack 101. In other words, the pillars 113 may be formed to substantially fill relatively larger openings including lower and upper portions of the extended openings 110'. The first deck 103 and the second deck 105 of the stack 101 may horizontally extend across the array region 107 and the staircase region 109 (FIG. 1A) of the electronic device 100, and the pillars 113 may be confined within the array region 107 of the electronic device 100. The pillars 113 may be formed to extend vertically from an upper surface of the second deck 105 to an upper surface of the source 102. The pillars 113 may each individually be formed of and include one or more materials (e.g., the cell material and the channel material) facilitating the formation of vertical strings of memory cells within the array region 107 for the electronic device 100 following subsequent processing (e.g., so called "replacement gate" or "gate last" processing) of the electronic device 100.

As shown in FIG. 1E, slots 118, which may also be referred to as "slits" or "replacement gate slots" may be formed through the stack 101. The slots 118 may be formed to vertically extend completely through the first deck 103 and the second deck 105 of the stack 101 and expose surfaces of the source 102. The slots 118 may be formed by, for example, exposing the electronic device 100 to one or more etchants through a mask (not shown) to remove portions of the insulative structures 106 and the additional insulative structures 108 of the stack 101. The slots 118 may divide the electronic device 100 into separate blocks. Individual blocks may each include a plurality (e.g., multiple, more than one) of the pillars 113.

After forming the slots 118, the additional insulative structures 108 (FIG. 1D) of the stack 101 may be at least partially (e.g., substantially) removed through the slots 118 through the replacement gate process to form cell openings 133. By way of non-limiting example, the additional insulative structures 108 may be at least partially removed by exposing the additional insulative structures 108 to an etch chemistry, such as a wet etch chemistry. The etch chemistry may include at least one wet etchant comprising one or more of phosphoric acid, sulfuric acid, hydrochloric acid, nitric acid, or another suitable etch chemistry. The additional insulative structures 108 may, for example, be removed by exposing the additional insulative structures 108 to a so-called "wet nitride strip" comprising phosphoric acid.

The remaining insulative structures 106 may extend laterally in a cantilever fashion and exhibit a relatively large aspect ratio (e.g., a ratio of a length of the insulative structures 106 (e.g., in the X-direction) to a thickness (e.g., in the Z-direction) thereof). A length of the insulative structures 106 between the pillars 113 and the slots 118 may be within a range from, for example, about 300 nm to about 350 nm, such as from about 300 nm to about 325 nm or from about 325 nm to about 350 nm. Of course, the disclosure is not so limited and the length may be different than those described. In some embodiments, the length is larger at lower portions of the stack 101 relative to other portions. Due to the large length relative to the thickness of the insulative structures 106, the insulative structures 106 of conventional electronic devices may be prone to failure and collapse. In addition, due to the larger length at the lower portions of the stack 101 (e.g., lower portions of the first deck 103) relative to other portions, the lowermost insulative structures 106 may be more prone to collapsing. However, since the support structures 116 extend substantially entirely through the stack 101 and are formed at an extreme edge of the insulative structures 106 immediately proximate the slots 118, the lowermost insulative structures 106 may be less prone to collapse compared to the insulative materials of conventional electronic devices.

As discussed above with reference to FIG. 1D, the material of the support structures 116 may be substantially homogeneous, or may be heterogeneous. An outermost material of the support structures 116 may include a material composition that differs from a material composition of the additional insulative structures 108 (FIG. 1D) and may exhibit an etch selectivity with respect to the additional insulative structures 108. In other words, an outermost material of the support structures 116 comprises a material composition that is not substantially removed responsive to exposure to etch chemistries formulated and configured to remove silicon nitride. Accordingly, the additional insulative structures 108 may be selectively removed through the replacement gate process without substantially removing material from the support structures 116.

FIG. 1F is an enlargement of the portion of FIG. 1E, indicated by the dashed line of box F, and illustrates a heterogeneous configuration of the support structures 116, with the support structures 116 including differing materials laterally adjacent to one another. With reference to FIG. 1F, the material of the support structures 116 may include one or more insulative (e.g., dielectric) materials, such as a first material 116a including, for example, a nitride material (e.g., a silicon nitride), and a second material 116b including, for example, an oxide material (e.g., silicon dioxide). In some embodiments, the first material 116a and the second material 116b are configured as the oxide-nitride-oxide (ONO) material. In other embodiments, the first material 116a and the second material 116b are configured as a nitride-oxide-nitride (NON) material, so long as the outermost material of the support structures 116 exhibits etch selectivity relative to the additional insulative structures 108.

The support structures 116 may be formed in the additional openings 111 (FIG. 1D), such as by forming (e.g., conformally forming) a portion of the second material 116b adjacent to the insulative structures 106 and the additional insulative structures 108 (FIG. 1D), forming (e.g., conformally forming) the first material 116a adjacent to the second material 116b, and forming (e.g., conformally forming) an additional portion of the second material 116b adjacent to the first material 116a. Accordingly, outer sidewalls of the second material 116b are in direct contact with the insulative structures 106, as shown in FIG. 1F, and are exposed by the cell openings 133 following removal of the additional insulative structures 108. The support structures 116 may be located proximal (e.g., immediately adjacent) to the slots 118 and may be positioned and configured (e.g., sized and shaped) so as not to inhibit (e.g., prevent) material removal acts and subsequent material deposition acts during the replacement gate process. In other words, multiple pathways may exist between and around the support structures 116 to facilitate removal of the additional insulative structures 108 and subsequent formation of the conductive structures.

Referring to FIG. 1G, conductive structures 138 may be formed between vertically neighboring insulative structures 106 at locations corresponding to the previous locations of the additional insulative structures 108. The conductive structures 138 may be formed within the cell openings 133. The stack 101 (FIG. 1E) may be converted into a conductive stack 131 including the vertically alternating arrangement of the conductive structures 138 and the insulative structures 106 arranged in tiers 132 (corresponding to the tiers 112 (FIG. 1E)). The conductive structures 138 may be configured as access lines, which may also be referred to as word lines. The conductive structures 138 may be formed of and include any conductive material including, but not limited to, n-doped polysilicon, p-doped polysilicon, undoped polysilicon, or a metal. In some embodiments, the conductive structures 138 comprise n-doped polysilicon. In other embodiments, the conductive structures 138 comprise tungsten.

One or more additional materials (e.g., dielectric barrier materials, conductive liner materials (not shown)) may be formed within the cell openings 133 (FIG. 1E) prior to forming the conductive structures 138. The conductive structures 138 may be formed adjacent to (e.g., vertically adjacent to, horizontally adjacent to) one or more of the additional materials, if present, within the cell openings 133 using the slots 118 (FIG. 1E). The conductive structures 138 may be formed using one or more conformal deposition techniques or growth techniques, such as one or more of an ALD process, a conformal CVD process, and an in situ growth process. The conductive structures 138 may be formed adjacent to (e.g., directly adjacent to) exposed surfaces of the support structures 116. Accordingly, the support structures 116 are substantially laterally surrounded by the insulative material of individual insulative structures 106 and by the conductive material of the individual conductive structures 138.

Following formation of the conductive structures 138, remaining (e.g., unfilled) portions of the slots 118 (FIG. 1E) may be substantially filled with an additional fill material 140. The additional fill material 140 may extend through the conductive stack 131 and be adjacent to (e.g., directly on) exposed upper surfaces of the source 102. The additional fill material 140 may be located between neighboring blocks at locations corresponding to the slots 118. The additional fill material 140 may be formed of and include at least one insulative material (e.g., a dielectric material). The additional fill material 140 may have substantially the same material composition as the insulative structures 106. In some embodiments, the additional fill material 140 may have substantially the same material composition as the support structures 116. The support structures 116 are laterally adjacent to the additional fill material 140 and are isolated therefrom by portions of the insulative structures 106 and the conductive structures 138. For example, the support structures 116 may be located between the additional fill material 140 and the pillars 113 most proximate the additional fill material 140 such that the support structures 116 are located around a perimeter (e.g., near lateral edges) of individual arrays of the pillars 113 within individual blocks of the array region 107.

As shown in FIG. 1G, the support structures 116 are separated from the additional fill material 140 by a distance $D^1$, and the support structures 116 are separated from the pillars 113 by a distance D2, which is relatively greater than the distance $D_1$. In other words, the support structures 116 are positioned relatively closer to the additional fill material 140 than to the pillars 113 most proximate (e.g., immediately adjacent) to the additional fill material 140. By way of non-limiting example, the distance $D_1$ between the support structures 116 and the additional fill material 140 may be within a range of from about 30 nm to about 120 nm, such as from about 30 nm to about 60 nm, from about 60 nm to about 90 nm, or from about 90 nm to about 120 nm, and the distance D2 between the support structures 116 and the pillars 113 may be within a range of from about 90 nm to about 150 nm, such as from about 90 nm to about 120 nm, or from about 120 nm to about 150 nm.

The support structures 116 may exhibit a width $W_1$ (e.g., a horizontal dimension in the X-direction), and the pillars 113 may exhibit a width $W_2$ that is relatively larger than the width $W_1$ of the support structures 116. By way of non-limiting example, the width $W_1$ of the support structures 116 may be within a range of from about 50 nm to about 200 nm, such as from about 50 nm to about 70 nm, from about 70 nm to about 100 nm, from about 100 nm to about 150 nm, or from about 150 nm to about 200 nm, and the width $W_2$ of the pillars 113 may be within a range of from about 60 nm to about 120 nm, such as from about 60 nm to about 80 nm, from about 80 nm to about 100 nm, or from about 100 nm to about 120 nm. The support structures 116 may exhibit a thickness $Th_1$ (e.g., in the X-direction) that is substantially similar to a thickness $Th_2$ of the cell film 113a of the pillars 113, each of which may be within a range of from about 50 nm to about 200 nm, such as from about 50 nm to about 70 nm, from about 70 nm to about 100 nm, from about 100 nm to about 150 nm, or from about 150 nm to about 200 nm. A height (defined as a vertical dimension between an upper surface of the upper insulative material 114 and an upper surface of the source 102) of the support structures 116 is substantially the same as a height of the pillars 113. In other words, upper surfaces of the pillars 113, the support structures 116, and the upper insulative material 114 may be substantially coplanar with one another.

The support structures 116 may serve as support structures during and/or after the formation of one or more components of the electronic device 100. For example, the support structures 116 within the array region 107 may provide support during the formation of the conductive structures 138 during replacement of the additional insulative structures 108 (FIG. 1D) with the conductive structures 138. By positioning the support structures 116 proximal to the slots 118, the support structures 116 may impede (e.g., prevent) tier collapse during the selective removal of the additional insulative structures 108.

As discussed above, FIG. 2A through FIG. 3B illustrate formation of the electronic device 100 within the staircase region 109. The staircase region 109 may be formed during (e.g., substantially simultaneous with) formation of the array region 107 illustrated in FIG. 1B through FIG. 1G. FIG. 2A is a simplified partial cross-sectional view of the staircase region 109 of the electronic device 100 at the processing stage depicted in FIG. 1A. The electronic device 100 within the staircase region 109 may include the stack 101 formed on or over the source 102 and the upper insulative material 114 formed on or over the stack 101. The stack 101 includes the vertically alternating sequence of the insulative structures 106 and the additional insulative structures 108 arranged in the tiers 112. The stack 101 may include the first deck 103 and the second deck 105 separated from the first deck 103 by the insulative material 104.

Referring to FIG. 2B, a portion of the upper insulative material 114 may be patterned to form an opening in the upper insulative material 114 and expose portions of the uppermost tier 112 of the stack 101. The uppermost tier 112 may be exposed to etch chemistries through the opening to remove portions of the uppermost tier 112 (including portions of the insulative structures 106 and the additional insulative structures 108 thereof) exposed through the opening. After removing the exposed portions of the uppermost tier 112 through the opening, the upper insulative material 114 may be exposed to an etch chemistry to remove (e.g., trim) additional portions of the upper insulative material 114 and expose additional portions of the uppermost tier 112 corresponding to a desired width (in the X-direction) of steps 126 of opposing stair step structures to be formed. After exposing the additional portions of the uppermost tier 112, the stack 101 is exposed to etch chemistries to remove portions of another tier 112 through the enlarged opening in the upper insulative material 114 and form another step 126. The process of trimming the upper insulative material 114 and etching the tiers 112 may be repeated a desired number of times to form a stadium structure 120 including a stair step structure 120a and an additional stair step structure 120b. The stair step structure 120a may exhibit a negative slope, and the additional stair step structure 120b may oppose (e.g., mirror) the stair step structure 120a and may exhibit a positive slope.

The stair step structure 120a and the additional stair step structure 120b of the stadium structure 120 may be separated from one another by a valley 122 (e.g., space, gap, trench, opening). A depth of the valley 122 may depend on a number of the opposing steps 126 of the stadium structure 120. The depth may be within a range from about 3 micrometers (µm) and about 20 µm, such as from about 3 µm to about 6 µm, from about 6 µm to about 9 µm, from about 9 µm to about 12 µm, from about 12 µm to about 15 µm, or from about 15 µm to about 20 µm.

Referring to FIG. 2C, a dielectric material 124 may be formed over the stack 101 and within the valley 122 (FIG. 2B). In some embodiments, the dielectric material 124 conformally overlies the stack 101 within the staircase region 109. The dielectric material 124 may comprise an insulative material. The dielectric material 124 may comprise an oxide material such as, for example, silicon dioxide, aluminum oxide, or another material. In some embodiments, the dielectric material 124 has a different material composition than a material composition of the insulative material 104, the insulative structures 106, and the additional insulative structures 108. In other embodiments, the dielectric material 124 has substantially the same material composition as one or more of the insulative material 104 and the insulative structures 106.

As shown in FIG. 2C, the extended openings 110' may be formed to extend vertically through the upper insulative material 114 and the stack 101, as in the embodiment of the array region 107 of FIG. 1C. However, within the staircase region 109, the extended openings 110' may be configured as contact openings (e.g., contact vias). The additional openings 111 may be formed laterally adjacent to the extended openings 110'. The additional openings 111 extend vertically through the upper insulative material 114 and the stack 101 and exhibit a height substantially similar to (e.g., the same as) a height of the extended openings 110'. The additional openings 111 may be formed during the same material removal act used to form the extended openings 110' or, alternatively, using one or more additional material removal acts. For example, the additional openings 111 may be formed during formation of the extended openings 110' using one masking act, which saves costs and reduces the number of total process acts. Alternatively, the additional openings 111 may be formed prior to forming the extended openings 110' (e.g., during formation of the stack 101). The extended openings 110' and the additional openings 111 within the staircase region 109 may be formed during formation of the extended openings 110' and the additional openings 111 within the array region 107 (FIG. 1C) or the extended openings 110' and the additional openings 111 within the staircase region 109 may be formed at a different time than formation of the extended openings 110' and the additional openings 111 within the array region 107.

The extended openings 110' and the additional openings 111 within the staircase region 109 may have any suitable transverse cross-sectional shape such as, for example, a substantially circular cross-sectional shape, a substantially square cross-sectional shape, a substantially elliptical cross-sectional shape, or a substantially triangular cross-sectional shape. In some embodiments, each of the extended openings 110' and the additional openings 111 may individually exhibit a substantially circular cross-sectional shape having a substantially circular cross-sectional area. In other embodiments, at least some of the additional openings 111 may individually exhibit an elongate cross-sectional shape, such as an oblong cross-sectional shape. While four extended openings 110' and two additional openings 111 are shown in FIG. 2C for clarity, any number of the extended openings 110' and the additional openings 111 may be formed laterally adjacent one another within the staircase region 109 of the electronic device 100.

Lower vertical boundaries of the extended openings 110' and the additional openings 111 may be defined by the upper surface of the source 102. Horizontal boundaries of the extended openings 110' and the additional openings 111 may be defined by surfaces (e.g., side surfaces) of each of the first deck 103 and the second deck 105 of the stack 101 (e.g., surfaces of the insulative structures 106 and the additional insulative structures 108 of the tiers 112), the insulative material 104, and the upper insulative material 114. Horizontal boundaries of the extended openings 110' may also be defined by the dielectric material 124 of the stadium structure 120, and horizontal boundaries of at least some of the extended openings 110' may be defined solely by the upper insulative material 114 and the dielectric material 124. The extended openings 110' and the additional openings 111 may be configured (e.g., sized and shaped) to receive subsequently formed structures, as shown in FIGS. 2D and 2E. The additional openings 111 may be formed laterally adjacent to (e.g., near lateral edges of) the stadium structure 120 within the staircase region 109 without being formed between neighboring extended openings 110' (e.g., within the stadium structure 120). In other words, the additional openings 111 are laterally adjacent to the dielectric material 124 of the stadium structure 120 and isolated therefrom by portions of the insulative structures 106 and the additional insulative structures 108, as shown in FIG. 2C. As in the array region 107 (FIG. 1C), the additional openings 111 may be formed proximal to areas designated for the slots 118 within the staircase region 109. Additionally, or alternatively, at least some of the additional openings 111 may be formed within central regions of individual blocks of the stack 101. For example, the additional openings 111 may be formed in one or more rows along a midline centrally located between areas designated for the slots 118, without being formed to surround individual extended openings 110'.

Referring to FIG. 2D, a liner 130a of support pillars 130 may be formed (e.g., conformally formed) within the extended openings 110' within the staircase region 109. The liner 130a may be continuous along a vertical distance of the stack 101, including the first deck 103 and the second deck 105. The liner 130a may be formed of and include an insulative material, such as an oxide material. For example, the material of the liner 130a may include a high quality silicon oxide material, such as an ALD SiO$_x$. The material of the liner 130a may exhibit an etch selectivity with respect to the additional insulative structures 108. The liner 130a is formed by conventional techniques, such as by CVD or ALD. In some embodiments, the liner 130a is formed by plasma enhanced ALD (PEALD).

The support structures 116 may be formed (e.g., conformally formed) within the additional openings 111 (FIG. 2C). As in the array region 107 of FIG. 1C, the support structures 116 within the staircase region 109 function as mechanical support structures positioned within selected regions of the stack 101 to provide uniform support when the stack 101 includes a large number of the tiers 112. The support structures 116 may be positioned proximal to the stadium structure 120 or proximal to regions of the stack 101 that are prone to tier collapse within the staircase region 109. For example, the support structures 116 may be positioned adjacent to the support pillars 130 external to the stadium structure 120 and proximate an area designated for the slots 118 (FIG. 2E). The support structures 116 are formed by conventional techniques, such as by CVD or ALD. In some embodiments, the support structures 116 may be formed by plasma enhanced ALD (PEALD).

The support structures 116 may be formed of and include at least one insulative material, for example, as discussed above with reference to FIG. 1C. Within the staircase region 109 of FIG. 2C, the material of the support structures 116 may be substantially homogeneous and include a single material including, for example, a high quality silicon oxide material, such as an ALD $SiO_x$. In some embodiments, the material of the support structures 116 has substantially the same material composition as the liner 130a of the support pillars 130. The support structures 116 may be formed at substantially the same time as the liner 130a of the support pillars 130 within the staircase region 109. In other words, the support structures 116 may be configured (e.g., sized and shaped) to be substantially the same as the liner 130a and may be formed during formation thereof. By forming the support structures 116 by completely filling the additional openings 111 (FIG. 2C) during formation of the liner 130a of the support pillars 130, manufacturing costs may be reduced. The support structures 116 of the staircase region 109 may be formed during formation of the support structures 116 within the array region 107 (FIG. 1C) or the support structures 116 may be formed at a different time than formation of the support structures 116 within the array region 107.

Referring to FIG. 2E, a fill material 130b of the support pillars 130 may be formed adjacent (e.g., over) the liner 130a, substantially filling the extended openings 110' (FIG. 2D). In some embodiments, the fill material 130b is formed of and includes an insulative material, such as a silicon oxide material. In other embodiments, the fill material 130b is formed of and includes a conductive material including, but not limited to, n-doped polysilicon, p-doped polysilicon, undoped polysilicon, or a metal, such as tungsten. The liner 130a may substantially surround sidewalls of the fill material 130b. In some embodiments, such as where the fill material 130b comprises an insulative material, the support pillars 130 may not include the liner 130a on sidewalls of the fill material 130b and the support pillars 130 may comprise only the fill material 130b (e.g., the insulative material).

The fill material 130b of the support pillars 130 may be formed to substantially fill remaining portions of the extended openings 110' (FIG. 2D) extending vertically through the first deck 103 and the second deck 105 of the stack 101 and to the source 102. The support pillars 130 may be within or proximate to the stadium structure 120 and may be confined within the staircase region 109 of the electronic device 100. At least some of the support pillars 130 (e.g., including only the insulative material) may be formed to extend vertically from an upper surface of the second deck 105 to an upper surface of the source 102. Alternatively or additionally, at least some of the support pillars 130 (e.g., including the conductive material as the fill material 130b) may be formed to extend below the upper surface of the source 102 and into portions thereof. For example, some of the support pillars 130 may be configured to extend vertically (e.g., in the Z-direction) through the stack 101 and physically contact (e.g., land on) a structure within the source 102 to facilitate a predetermined function (e.g., an electrical interconnection function, a support function) of the support pillars 130. In other embodiments, the support pillars 130 do not provide electrical interconnection and serve primarily (e.g., only) to provide support. Upper surfaces of each of the upper insulative material 114, the support structures 116, and the support pillars 130 may be substantially coplanar with one another.

As shown in FIG. 2E, the slots 118 may be formed through the stack 101 and laterally adjacent to the stadium structure 120. As in the array region 107 (FIG. 1E), the slots 118 of the staircase region 109 may be formed to vertically extend completely through the first deck 103 and the second deck 105 of the stack 101 and expose surfaces of the source 102. After forming the slots 118, the additional insulative structures 108 (FIG. 2D) of the stack 101 may be at least partially (e.g., substantially) removed through the slots 118 during the replacement gate process to form the cell openings 133. The slots 118 of the staircase region 109 may be formed during formation of the slots 118 within the array region 107 or at a different time. The additional insulative structures 108 may be removed through the slots 118 during the replacement gate process of the array region 107 or at a different time.

The material of the additional insulative structures 108 (FIG. 2D) may include a material composition that differs from a material composition of the support structures 116 and may be selectively etchable relative to the support structures 116. Since the materials of the support structures 116 and the additional insulative structures 108 are selectively etchable relative to one another, the additional insulative structures 108 may be removed during the replacement gate process within the staircase region 109 without substantially removing material from the support structures 116. The remaining insulative structures 106 may extend laterally in a cantilever fashion within the staircase region 109, as in the array region 107 (FIG. 1E). Since the support structures 116 extend substantially entirely through the stack 101 and are formed at an extreme edge of the insulative structures 106 and immediately proximate the slots 118, the lowermost insulative structures 106 may be less prone to collapse compared to the insulative materials of conventional electronic devices at a similar stage in the process.

FIG. 2F illustrates the electronic device 100 after replacing the additional insulative structures 108 (FIG. 2D) with a conductive material to form the conductive structures 138 and form the conductive stack 131. The conductive stack 131 includes the vertically alternating arrangement of the conductive structures 138 and the insulative structures 106 arranged in tiers 132 (corresponding to the tiers 112 (FIG. 2E)). One or more of the uppermost conductive structures 138 may form select gate structures 138a, which may comprise one or more select gate drain (SGD) structures. A lowermost one of the conductive structures 138 (e.g., the conductive structures 138 most proximate the source 102) may form a select gate structure 138b, which may comprise a select gate source (SGS) structure. Accordingly, the conductive stack 131 may include an upper region 144 (e.g., an SGD region) and a lower region 146 (e.g., a non-SGD region) underlying the upper region 144. For clarity and ease of understanding the drawings and associated description, the support pillars 130 are not shown in FIGS. 2F and 2G. However, and as shown most clearly in the perspectives of FIGS. 3A and 3B, the support pillars 130 are present in the electronic device 100.

As in the array region 107 (FIG. 1G), the conductive structures 138 in the staircase region 109 may be configured as access lines (e.g., word lines). The conductive structures 138 may be formed of and include any conductive material including, but not limited to, n-doped polysilicon, p-doped polysilicon, undoped polysilicon, or a metal. In some embodiments, the conductive structures 138 comprise n-doped polysilicon. In other embodiments, the conductive structures 138 comprise tungsten.

Following formation of the conductive structures 138, remaining (e.g., unfilled) portions of the slots 118 (FIG. 2E) may be substantially filled with the additional fill material 140 (e.g., a dielectric material). The additional fill material 140 may extend through the conductive stack 131 and be adjacent to (e.g., directly on) exposed upper surfaces of the source 102. In addition, the additional fill material 140 may be located between neighboring blocks at locations corresponding to the slots 118. The support structures 116 are laterally adjacent to the additional fill material 140 and are isolated therefrom by portions of the insulative structures 106 and the conductive structures 138. For example, the support structures 116 within the staircase region 109 may be between the additional fill material 140 and the stadium structure 120 and may be located around a perimeter (e.g., near lateral edges) of the stadium structure 120.

As shown in FIG. 2F, openings 134 may be formed within the dielectric material 124 of the stadium structure 120. The openings 134 extend vertically through the dielectric material 124 to expose the conductive structures 138 of the conductive stack 131 and the steps 126 of the stadium structure 120. The openings 134 may have any suitable transverse cross-sectional shape such as, for example, a substantially circular cross-sectional shape, a substantially square cross-sectional shape, a substantially elliptical cross-sectional shape, or a substantially triangular cross-sectional shape. In some embodiments, each of the openings 134 may individually exhibit a substantially circular cross-sectional shape having a substantially circular cross-sectional area. While four openings 134 are shown in FIG. 2F for clarity, additional openings 134 may be formed within the staircase region 109.

Lower vertical boundaries of the openings 134 may be defined by upper surfaces of the conductive structures 138 (e.g., the steps 126 of the stadium structure 120). Horizontal boundaries of the openings 134 may be defined by surfaces (e.g., side surfaces) of each of the upper insulative material 114 and the dielectric material 124. The openings 134 may be configured (e.g., sized and shaped) to receive subsequently formed structures, as shown in FIG. 2G. The openings 134 may be relatively larger or, alternatively, substantially the same as that of the additional openings 111 (FIG. 2C) including the support structures 116.

With reference to FIG. 2G, conductive contacts 136 may be formed within the openings 134. For example, the conductive contacts 136 may extend through the dielectric material 124 to individually contact the conductive structures 138 of the conductive stack 131 and the steps 126 of the stadium structure 120. The conductive contacts 136 include a liner 136a and a conductive material 136b. The liner 136a may comprise an insulative material, such as one or more of the insulative materials of the liner 130a (FIG. 2E) of the support pillars 130 (FIG. 2E). The conductive material 136b may be one or more of the conductive materials described above with reference to the conductive structures 138. In some embodiments, the conductive material 136b of the conductive contacts 136 comprises the same material composition as the conductive structures 138. Upper surfaces of the conductive contacts 136 may be planarized, such as by one or more CMP acts to facilitate or enhance the planarity of upper boundaries (e.g., upper surfaces) of the conductive contacts 136 for further processing thereon. While four conductive contacts 136 are shown in FIG. 2G for clarity, additional conductive contacts 136 may be formed within the staircase region 109.

Following formation of the conductive contacts 136, an additional dielectric material 142 may be formed on or over each of the upper insulative material 114, the support structures 116, and the conductive contacts 136. In some embodiments, portions of the additional fill material 140 may extend through the additional dielectric material 142 such that upper surfaces of the additional fill material 140 are vertically elevated above an upper surface of the additional dielectric material 142, as shown in FIG. 2G. In other embodiments, the upper surfaces of the additional fill material 140 may be substantially coplanar with or, alternatively, recessed below the upper surface of the additional dielectric material 142. The additional dielectric material 142 may be formed of and include an insulative material. The additional dielectric material 142 may comprise the same material composition as the insulative structures 106. In some embodiments, the additional dielectric material 142 comprises silicon dioxide. The additional dielectric material 142 may exhibit an etch selectivity relative to one or more of the upper insulative material 114 and the additional fill material 140. A lower surface of the additional dielectric material 142 may be substantially planar. Accordingly, upper surfaces of each of the upper insulative material 114, the support structures 116, the support pillars 130 (FIG. 2E), and the conductive contacts 136 may be substantially coplanar with one another and coincident with the lower surface of the additional dielectric material 142. Electronic devices including the support structures 116 formed in accordance with embodiments of the disclosure may be formed by conducting additional process acts, which are not described in detail herein.

FIGS. 3A and 3B are simplified top down views illustrating the electronic device 100. The top down view of FIG. 3A is taken along the A-A line in FIG. 2G, and the top down view of FIG. 3B is taken along the B-B line in FIG. 2G. FIG. 3A illustrates the upper region 144 (e.g., the SGD region) of the conductive stack 131 within the staircase region 109, and FIG. 3B illustrates the lower region 146 (e.g., the non-SGD region) thereof. The upper region 144 differs from the lower region 146 in the placement of the conductive contacts 136. In other words, a pattern of the conductive contacts 136 electrically connected to the select gate structures 138a differs from a pattern of the conductive contacts 136 electrically connected to lower portions of the conductive structures 138 of the stack 101. In the upper region 144, for example, the conductive contacts 136 may be laterally aligned in rows extending in the X-direction with individual conductive contacts 136 positioned in lateral alignment with columns of the support pillars 130 extending in the Y-direction, as shown in FIG. 3A. In the lower region 146, for example, the conductive contacts 136 may be laterally aligned in columns extending in the Y-direction with individual conductive contacts 136 positioned out of lateral alignment (e.g., staggered) with rows of the support pillars 130 extending in the X-direction, as shown in FIG. 3B, although other configurations of the conductive contacts 136 relative to the support pillars 130 may be contemplated.

Referring collectively to FIGS. 3A and 3B, individual support structures 116 are spaced apart from one another in at least one horizontal direction (the X-direction, the Y-direction). In other words, the individual support structures 116 may include discrete (e.g., discontinuous) structures in at least one horizontal direction. As used herein, the term "discrete" means and includes a material or structure that is defined by one or more differing materials or structures. For example, the insulative structures 106 (FIG. 2G) and the conductive structures 138 substantially laterally surround (e.g., substantially continuously laterally surround) the individual support structures 116. Further, each of the support structures 116 are spaced apart from the support pillars 130 in at least one horizontal direction. In other words, the support structures 116 are separated from the support pillars 130 by the insulative structures 106 and the conductive structures 138.

As best shown in FIGS. 3A and 3B, each of the support pillars 130 and the conductive contacts 136 may individually exhibit a substantially circular cross-sectional shape. In some embodiments, the support structures 116 exhibit a substantially circular cross-sectional shape. In other embodiments, the support structures 116 exhibit a different cross-sectional shape than one or more (e.g., each) of the support pillars 130 and the conductive contacts 136. For example, the support structures 116 may exhibit a lateral dimension (e.g., a length, a diameter) in a first lateral direction that is larger than another dimension (e.g., a width, a diameter) in a second lateral direction, substantially transverse to the first lateral direction. In other words, at least some of the support structures 116 exhibit a substantially elliptical (e.g., oblong, oval) cross-sectional shape. For example, the support structures 116 may exhibit an oblong shape and may be elongated in one lateral direction (e.g., the Y-direction). In other embodiments, at least some of the support pillars 130 and/or the conductive contacts 136 individually exhibit a substantially elliptical cross-sectional shape. Accordingly, one or more of the support pillars 130, the conductive contacts 136, and the support structures 116 individually exhibits a substantially circular cross-sectional shape or a substantially elliptical cross-sectional shape.

Each of the support structures 116 may exhibit substantially the same geometric configuration (e.g., the same dimensions and the same shape) and horizontal spacing (e.g., in the Y-direction) as each of the other support structures 116. Alternatively, at least some of the support structures 116 may exhibit a different geometric configuration (e.g., one or more different dimensions, a different shape) and/or different horizontal spacing than at least some other of the support structures 116. In some embodiments, the support structures 116 are at least partially uniformly spaced in the Y-direction. For example, the support structures 116 may be arranged in columns extending in the Y-direction and may be laterally (e.g., horizontally) aligned with one or more rows of the conductive contacts 136 in the X-direction. In some embodiments, the support structures 116 are laterally aligned with the conductive contacts 136 and laterally offset from the support pillars 130 in the X-direction. In other words, the support structures 116 may be laterally aligned with the conductive contacts 136 without being laterally aligned with the support pillars 130. In other embodiments, the support structures 116 are at least partially non-uniformly spaced in the Y-direction such that at least some of the support structures 116 are not laterally aligned with the rows of the conductive contacts 136. In some such embodiments, the support structures 116 may be laterally aligned with rows of the support pillars 130 or, alternatively, not laterally aligned with rows of either of the support pillars 130 and the conductive contacts 136.

A single (e.g., one) of the support structures 116 may be located on one or both (e.g., each) opposing side of individual rows of the conductive contacts 136 within individual blocks of the conductive stack 131 (FIG. 2G) without being located between neighboring conductive contacts 136. In other words, two of the support structures 116 are in lateral alignment with individual rows of the conductive contacts 136 within individual blocks of FIG. 3A, such that a single support structure 116 horizontally intervenes between an outermost one of the conductive contacts 136 and one of the slots 118. Thus, the conductive contacts 136 may be laterally separated from the slots 118 by one of the support structures 116. Further, the support structures 116 may not alternate with the conductive contacts 136 in a horizontal direction (e.g., the X-direction) such that the support structures 116 are located only along lateral edges of the individual blocks.

As shown in FIG. 3B (and equally applicable to FIG. 3A), the support structures 116 in the staircase region 109 are separated from the additional fill material 140 of the slots 118 by the distance $D_1$, similar to that of the support structures 116 in the array region 107 (FIG. 1G). The support structures 116 are separated from the support pillars 130 by a distance $D_3$, which is relatively greater than the distance $D_1$. Stated another way, the support structures 116 are relatively closer to the additional fill material 140 than to the support pillars 130 most proximate (e.g., immediately adjacent) to the additional fill material 140. Thus, the slots 118 filled with the additional fill material 140 are positioned relatively closer to the support structures 116 than to the support pillars 130. By way of non-limiting example, the distance $D_1$ between the support structures 116 and the additional fill material 140 may be within a range of from about 30 nm to about 120 nm, such as from about 30 nm to about 60 nm, from about 60 nm to about 90 nm, or from about 90 nm to about 120 nm, and the distance $D_3$ between the support structures 116 and the support pillars 130 may be within a range of from about 90 nm to about 150 nm, such as 90 nm to about 120 nm, or from about 120 nm to about 150 nm. Further, a distance $D_4$ (e.g., taken on a diagonal) between the support structures 116 and the additional fill material 140 may be within a range of from about 90 nm to about 150 nm, such as 90 nm to about 120 nm, or from about 120 nm to about 150 nm, and a distance $D_5$ (e.g., taken on the diagonal) between the support pillars 130 and the additional fill material 140 may be relatively greater than the distance $D_4$ and may be within a range of from about 200 nm to about 500 nm, such as 200 nm to about 300 nm, from about 300 nm to about 400 nm, or from about 400 nm to about 500 nm.

As in the array region 107 (FIG. 1G), the support structures 116 within the staircase region 109 may exhibit the width $W_1$ (e.g., the horizontal dimension in the X-direction). The support pillars 130 may exhibit a width $W_3$ larger than the width $W_1$ of the support structures 116, and the conductive contacts 136 may exhibit a width $W_4$ larger than or, alternatively, substantially equal to the width $W_1$ of the support structures 116. Accordingly, the support pillars 130 exhibit a lateral dimension (e.g., the width $W_3$) relatively larger than a lateral dimension (e.g., the width $W_1$, the width $W_4$) of each of the support structures 116 and the conductive contacts 136, respectively. In some embodiments, the support pillars 130 may exhibit a reduced size compared to conventional support pillars. By way of non-limiting example, the width $W_1$ of the support structures 116 may be within a range of from about 50 nm to about 200 nm, such as from about 50 nm to about 70 nm, from about 70 nm to about 100 nm, from about 100 nm to about 150 nm, or from about 150 nm to about 200 nm. The width $W_3$ of the support pillars 130 may be within a range of from about 200 nm to about 500 nm, such as from about 200 nm to about 300 nm, from about 300 nm to about 400 nm, or from about 400 nm to about 500 nm, and the width $W_4$ of the conductive contacts 136 may be within a range of from about 50 nm to about 200 nm, such as from about 50 nm to about 100 nm, from about 100 nm to about 150 nm, or from about 150 nm to about 200 nm. The support structures 116 in the staircase region 109 may exhibit the thickness $Th_1$ (e.g., in the X-direction) that is substantially similar to a thickness $Th_3$ of the liner 130a of the support pillars 130, each of which may be within a range of from about 50 nm to about 200 nm, such as from about 50 nm to about 70 nm, from about 70 nm to about 100 nm, from about 100 nm to about 150 nm, or from about 150 nm to about 200 nm.

The support structures 116 may serve as mechanical support structures during and/or after the formation of one or more components of the electronic device 100. For example, the support structures 116 within the staircase region 109 may provide support in addition to support provided by the support pillars 130, for the formation of the conductive structures 138 during the replacement gate process. The support structures 116 may reduce (e.g., prevent) tier collapse during the selective removal of the additional insulative structures 108. In addition, formation of the support structures 116 may facilitate a decreased size of the support pillars 130, which in turn may facilitate an increased density of the support pillars 130 within the staircase region 109.

Accordingly, the conductive stack 131 of the electronic device 100 may include the support structures 116 between the stadium structure 120 and the filled slots 118 within the staircase region 109 and between the pillars 113 and the filled slots 118 within the array region 107. The support structures 116 may be positioned and configured (e.g., sized and shaped) to inhibit (e.g., prevent) undesirable tier deformations (e.g., tier warping) and/or tier collapse. For example, the support structures 116 may provide increased structural support at locations horizontally proximate to the filled slots 118 and corresponding to horizontal ends (e.g., horizontal boundaries in the X-direction) of large cantilever structures of the insulative structures 106 within individual blocks of the conductive stack 131. By forming the additional openings 111 of the support structures 116 during formation of the extended openings 110' of one or more of the pillars 113 and the support pillars 130, one masking act may be utilized, which saves costs and reduces the number of total process acts. In addition, by forming the support structures 116 during formation of the cell material of the cell film 113a of the pillars 113 within the array region 107 and during formation of the liner 130a of the support pillars 130 in the staircase region 109, manufacturing costs may be further reduced.

The configuration of the support structures 116 may prevent the risk of undesirable current leakage and short circuits in the conductive stack 131 during use and operation of the electronic device 100, compared to conventional electronic devices lacking the support structures, without significantly affecting conductivity of the conductive structures 138. For example, the material of the additional insulative structures 108 may be selectively etchable relative to the material of the support structures 116 to minimize (e.g., prevent) loss of material thereof during subsequent process acts. However, any decrease in the width of the support structures 116 may provide an increased surface area available for subsequently formed conductive structures (e.g., the conductive structures 138).

Conventional electronic devices may exhibit differential stress (e.g., differing compressive stress) on adjacent structures as a result of local stresses existing in large cantilever structures (e.g., insulative structures of tiers) in the bottom of a conductive stack. In addition, conventional electronic devices may exhibit wafer bow as a result of differing lengths among the insulative structures due to tapering of adjacent structures (e.g., pillars, stadium structures) at differing elevations of the conductive stack. The local stresses on adjacent structures and the wafer bow may result in contact misalignment (e.g., misalignment between conductive contacts and conductive structures of the tiers). By way of contrast, the support structures 116 according to embodiments of the disclosure may provide additional mechanical support at horizontal ends of the insulative structures 106 compared to only providing conventional support pillars.

Accordingly, in some embodiments, an electronic device comprises a stack structure comprising tiers of alternating conductive structures and insulative structures, staircase structures within the stack structure and including steps defined by edges of the tiers, contacts on the steps of the staircase structures, support pillars extending vertically through the stack structure, and support structures laterally adjacent to the contacts in a first horizontal direction and extending vertically through the stack structure. The support pillars exhibit a lateral dimension relatively larger than a lateral dimension of the contacts and the support structures.

Accordingly, in at least some embodiments, a method of forming an electronic device comprises forming pillars in a stack comprising alternating first materials and second materials within an array region, forming stair step structures in the stack within a staircase region laterally adjacent to the array region, forming support pillars comprising a liner and a fill material within the staircase region, forming support structures extending vertically through the stack within one or more of the array region and the staircase region, forming slots extending through the stack, and forming conductive contacts on individual steps of the stair step structures. The slots are positioned relatively closer to the support structures than to the support pillars.

Figure 4:
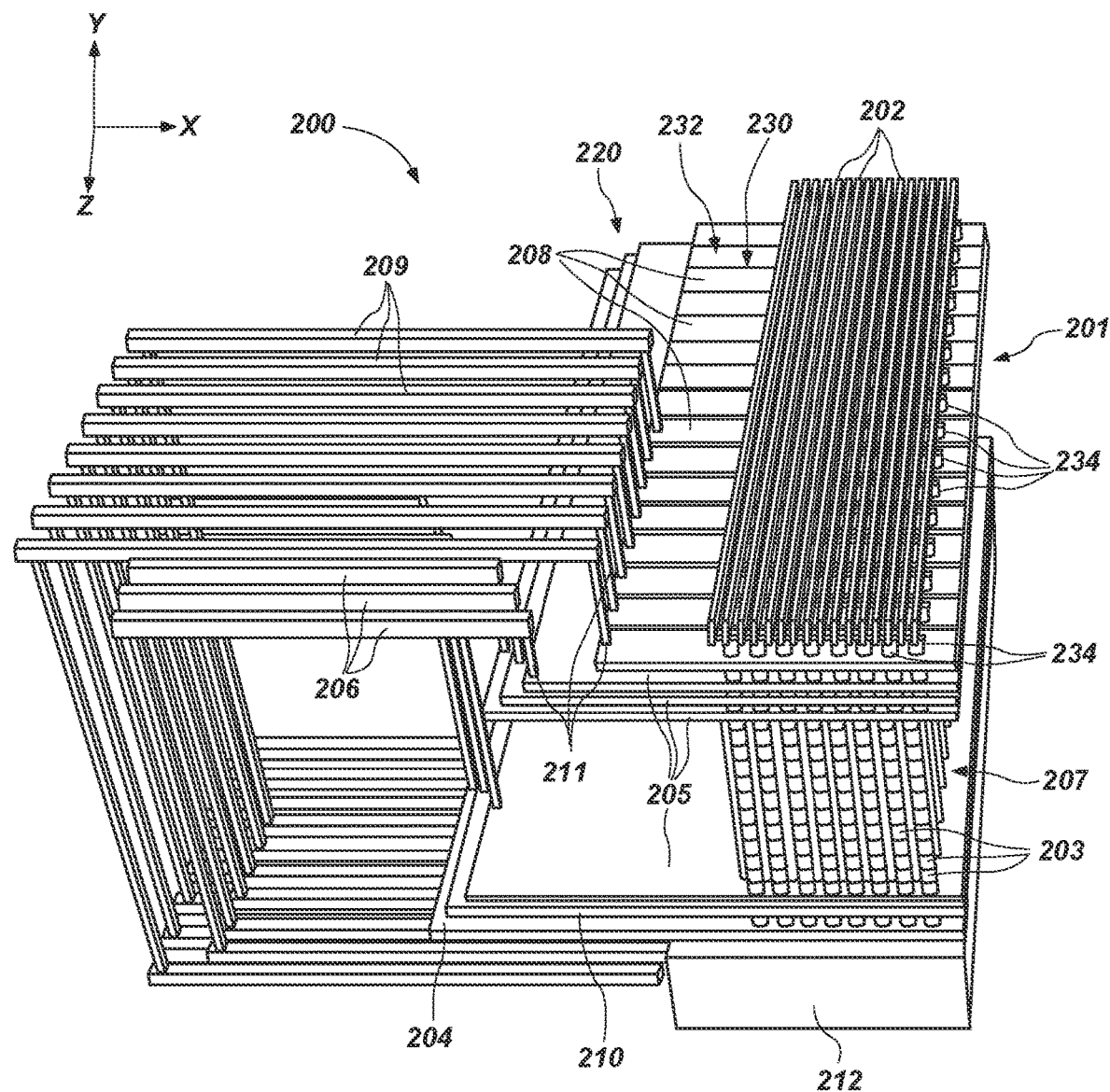
FIG. 4 is a partial cutaway perspective view of an electronic device, in accordance with embodiments of the disclosure.

FIG. 4 illustrates a partial cutaway perspective view of a portion of an electronic device 200 (e.g., a microelectronic device, a memory device, such as a 3D NAND Flash memory device) including one or more electronic device structures 201 (e.g., a microelectronic device structure). The electronic device 200 may be substantially similar to the electronic device 100 previously described with reference to FIG. 1A through FIG. 3B. As shown in FIG. 4, the electronic device structure 201 of the electronic device 200 may include a staircase structure 220 (e.g., corresponding to the stadium structure 120 (FIG. 2G)) defining contact regions for connecting interconnect lines 206 to conductive structures 205 (e.g., corresponding to the conductive structures 138 (FIGS. 1G and 2G)). The electronic device structure 201 may include vertical strings 207 of memory cells 203 (e.g., corresponding to the pillars 113) that are coupled to each other in series. The vertical strings 207 may extend vertically (e.g., in the Z-direction) and orthogonally to conductive lines and the conductive structures 205, such as data lines 202, a source tier 204 (e.g., including the source 102 (FIGS. 1G and 2G)), the interconnect lines 206, first select gates 208 (e.g., upper select gates, drain select gates (SGDs) corresponding to the select gate structures 138*a* (FIG. 2G)), select lines 209, and a second select gate 210 (e.g., a lower select gate, a source select gate (SGS) corresponding to the select gate structure 138*b* (FIG. 2G)). The select gates 208 may be horizontally divided (e.g., in the Y-direction) into multiple blocks 232 horizontally separated (e.g., in the Y-direction) from one another by slots 230 (e.g., the additional fill material 140 (FIGS. 1G and 2G) formed within the slots 118 (FIGS. 1E and 2E)).

Vertical conductive contacts 211 may electrically couple components to each other as shown. For example, the select lines 209 may be electrically coupled to the first select gates 208 and the interconnect lines 206 may be electrically coupled to the conductive structures 205. The electronic device 200 may also include a control unit 212 positioned under the memory array, which may include at least one of string driver circuitry, pass gates, circuitry for selecting gates, circuitry for selecting conductive lines (e.g., the data lines 202, the interconnect lines 206), circuitry for amplifying signals, and circuitry for sensing signals. The control unit 212 may be electrically coupled to the data lines 202, the source tier 204, the interconnect lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending the second direction (e.g., the Y-direction) at the first end (e.g., the upper end) of the vertical strings 207 of the individual groups. Additional individual groups of the vertical strings 207 extending the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word lines) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the interconnect lines 206 and the conductive structures 205 through the vertical conductive contacts 211. In other words, an individual conductive structure 205 may be selected via an interconnect line 206 in electrical communication with a respective vertical conductive contact 211 in electrical communication with the conductive structure 205. The data lines 202 may be electrically coupled to the vertical strings 207 through conductive contact structures 234.

Accordingly, in at least some embodiments, a memory device comprises strings of memory cells within an array region and extending vertically through a stack of alternating dielectric materials and conductive materials, and at least one stair step structure within a staircase region of the stack. The at least one stair step structure includes steps defined by horizontal ends of the conductive materials. The memory device includes conductive contacts physically contacting the steps of the at least one stair step structure, first support structures extending vertically through the stack within the at least one stair step structure, and second support structures extending vertically through the stack within one or more of the array region and the staircase region and external to the at least one stair step structure. Each of the second support structures exhibits a smaller lateral cross-sectional area than each of the first support structures.

Figure 5:
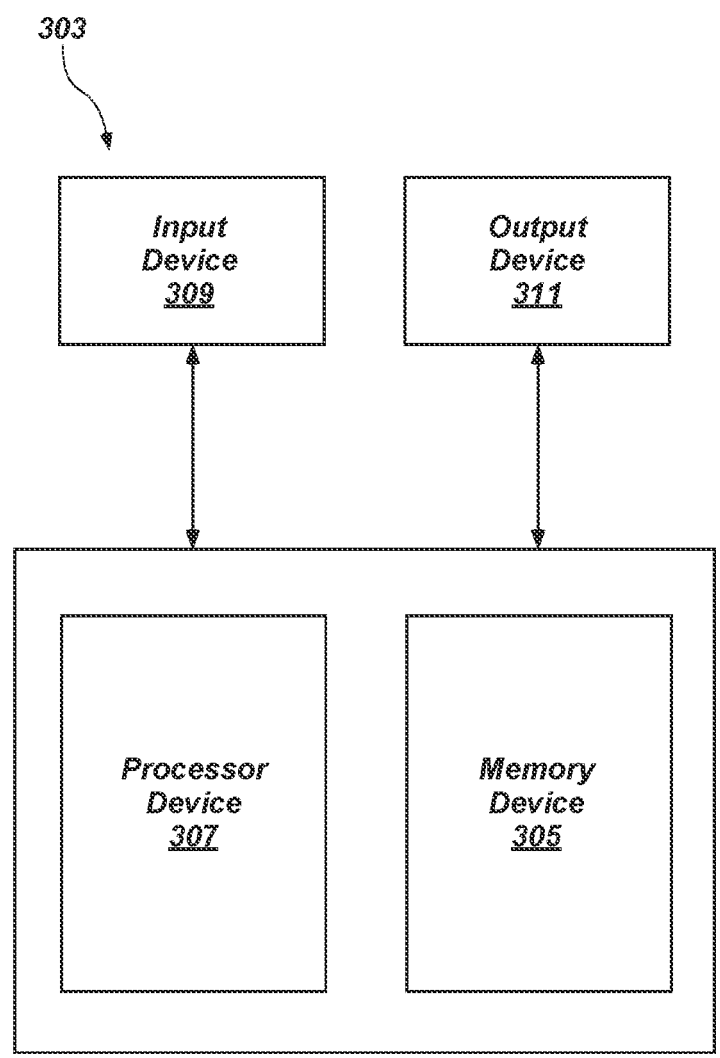
FIG. 5 is a block diagram of an electronic system, in accordance with embodiments of the disclosure.
Figure 6:
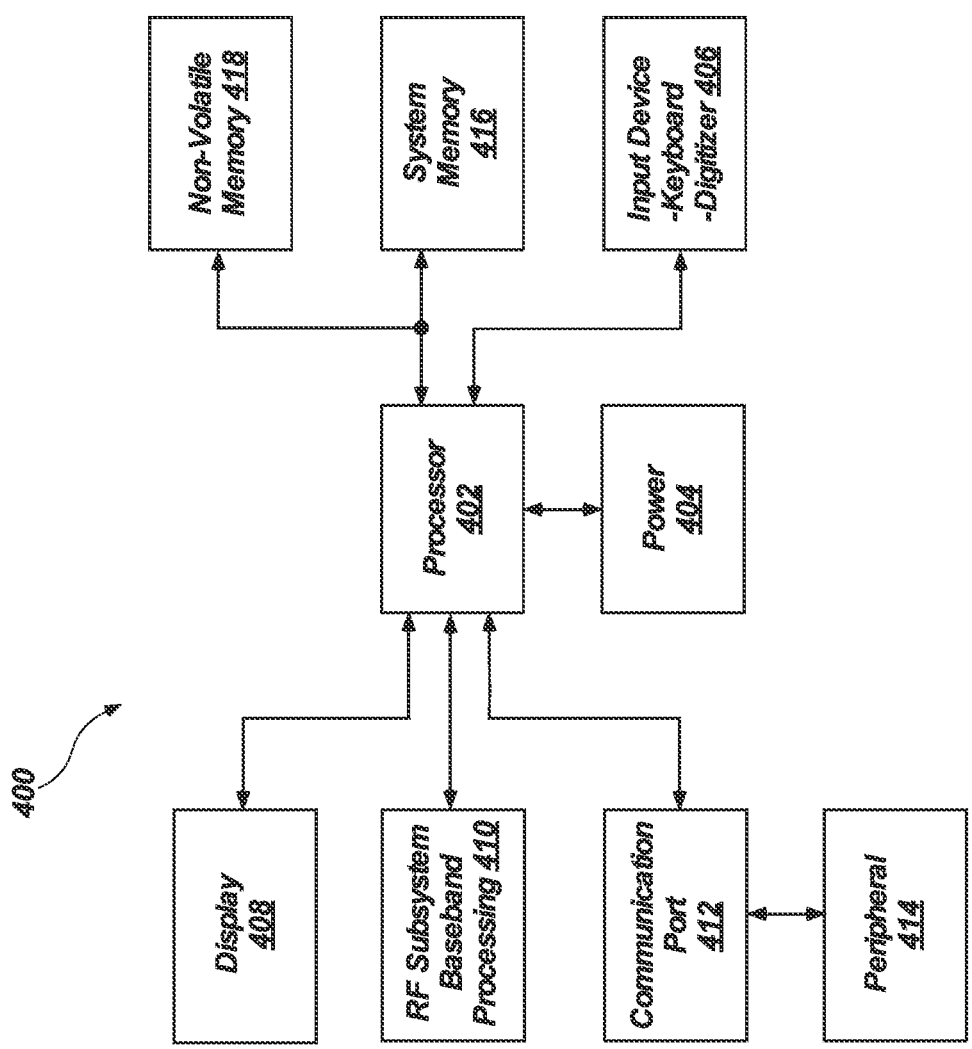
FIG. 6 is a block diagram of a processor-based system, in accordance with embodiments of the disclosure.

Electronic devices (e.g., the electronic devices 100, 200) including the support structures 116 within one or more of the array region 107 and the staircase region 109, according to embodiments of the disclosure, may be used in embodiments of electronic systems of the disclosure. For example, FIG. 5 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of an electronic device previously described herein (e.g., the electronic devices 100, 200 previously described with reference to FIG. 1A through FIG. 3B and FIG. 4) including the support structures 116 within one or more of the array region 107 and the staircase region 109.

The electronic system 303 may further include at least one electronic signal processor device 307 (often referred to as a "microprocessor"). The electronic signal processor device 307 may optionally include an embodiment of an electronic device previously described herein (e.g., one or more of the electronic devices 100, 200 previously described with reference to FIG. 1A through FIG. 3B and FIG. 4). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

With reference to FIG. 4, depicted is a processor-based system 400. The processor-based system 400 may include various electronic devices (e.g., the electronic devices 100, 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic devices (e.g., the electronic devices 100, 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the electronic devices (e.g., the electronic devices 100, 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include electronic devices, such as the electronic devices (e.g., the electronic devices 100, 200) described above, or a combination thereof.

Accordingly, in at least some embodiments, a system comprises a processor operably coupled to an input device and an output device, and one or more electronic devices operably coupled to the processor. The one or more electronic devices comprises a stack comprising tiers of alternating conductive structures and insulating structures, stadium structures within the stack and comprising opposing stair step structures each individually including steps defined by edges of the tiers, contact structures on the steps of the opposing stair step structures, slots extending through the stack, and support structures between the slots and the contact structures and extending vertically through the stack. The support structures exhibit oblong cross-sectional shapes horizontally aligned with the conductive structures without being located between neighboring conductive contacts.

The electronic devices and systems of the disclosure advantageously facilitate one or more of improved simplicity, greater packaging density, and increased miniaturization of components as compared to conventional devices and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional electronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
a stack structure comprising tiers of alternating conductive structures and insulative structures;
staircase structures within the stack structure and including steps defined by edges of the tiers;
contacts on the steps of the staircase structures;
support pillars extending vertically through the stack structure;
support structures laterally adjacent to the contacts in a first horizontal direction and extending vertically through the stack structure, the support pillars exhibiting a lateral dimension relatively larger than a lateral dimension of the contacts and the support structures; and
a dielectric material within replacement gate slots extending through the stack structure, the support structures relatively closer to the replacement gate slots than to the support pillars in the first horizontal direction.

2. The electronic device of claim 1, wherein a single support structure horizontally intervenes between one of the replacement gate slots and one of the contacts most proximate thereto.

3. The electronic device of claim 1, wherein the support structures are horizontally aligned with the contacts and horizontally offset from the support pillars in the first horizontal direction.

4. The electronic device of claim 1, wherein one or more of the support pillars, the contacts, and the support structures individually exhibits a substantially circular cross-sectional shape or a substantially elliptical cross-sectional shape.

5. The electronic device of claim 1, wherein at least some of the support structures exhibit oblong cross-sectional shapes having elongated portions extending in a second horizontal direction orthogonal to the first horizontal direction.

6. The electronic device of claim 1, wherein at least some of the support pillars comprise a conductive material and the support structures are substantially devoid of a conductive material.

7. The electronic device of claim 1, wherein the support structures comprise a single material comprising silicon dioxide, a material composition of the support structures being substantially the same as a material composition of a liner of the support pillars.

8. The electronic device of claim 1, further comprising memory pillars in an array region and laterally adjacent to the staircase structures and additional support structures laterally adjacent to the memory pillars, wherein each of the additional support structures and individual memory pillars of the array region comprises an oxide-nitride-oxide material.

9. The electronic device of claim 1, further comprising a source underlying the stack structure, each of the support pillars and the support structures extending substantially entirely through the stack structure and contacting the source.

10. A method of forming an electronic device, the method comprising:
forming pillars in a stack comprising alternating first materials and second materials within an array region;
forming an upper insulative material over the stack;
forming stair step structures in the stack within a staircase region laterally adjacent to the array region;
forming support pillars comprising a liner and a fill material within the staircase region;
forming support structures extending vertically through the stack within one or more of the array region and the staircase region;
forming slots extending through the stack, the slots positioned relatively closer to the support structures than to the support pillars; and
forming conductive contacts on individual steps of the stair step structures, upper surfaces of each of the upper insulative material, the support pillars, the support structures, and the conductive contacts substantially coplanar with one another.

11. The method of claim 10, wherein forming the support pillars and forming the support structures comprises forming openings for the support pillars and forming additional openings for the support structures using a single masking act.

12. The method of claim 11, wherein:
forming the pillars comprises conformally forming a cell film within pillar openings and forming a fill material within a central region of the pillar openings; and
forming the support structures comprises conformally forming at least one insulative material within the additional openings,
wherein forming the pillars and forming the support structures occur at substantially the same time.

13. The method of claim 10, wherein forming the support structures comprises selecting an outermost material of the support structures to exhibit an etch selectivity with respect to one of the first materials and the second materials of the stack.

14. The method of claim 10, wherein forming the support structures comprises forming a single insulative material using a plasma enhanced atomic layer deposition process during formation of the liner of the support pillars, a thickness of the liner of the support pillars being substantially the same as a thickness of the support structures.

15. The method of claim 10, wherein forming the support structures comprises forming an oxide material laterally adjacent to the first materials and the second materials of the stack within the array region and forming a nitride material laterally adjacent to the oxide material, the oxide material substantially laterally surrounding the nitride material.

16. The method of claim 10, wherein forming the support structures comprises positioning the support structures adjacent to the slots without forming the support structures between neighboring conductive contacts.

17. A memory device, comprising:
strings of memory cells within an array region and extending vertically through a stack of alternating dielectric materials and conductive materials;
at least one stair step structure within a staircase region of the stack, the at least one stair step structure including steps defined by horizontal ends of the conductive materials;
conductive contacts physically contacting the steps of the at least one stair step structure;
first support structures extending vertically through the stack within the at least one stair step structure, at least some of the first support structures comprising a conductive material; and
second support structures extending vertically through the stack within one or more of the array region and the staircase region and external to the at least one stair step structure, each of the second support structures comprising an insulative material without comprising a conductive material, and each of the second support structures exhibiting a smaller lateral cross-sectional area than each of the first support structures.

18. The memory device of claim 17, further comprising filled slots laterally adjacent to the at least one stair step structure, wherein the second support structures are relatively longer in a direction parallel to the filled slots than in another direction orthogonal to the filled slots.

19. The memory device of claim 18, wherein the conductive contacts are laterally separated from the filled slots by one of the second support structures, the second support structures located within a distance of from about 30 nm to about 120 nm from a lateral side boundary of the filled slots.

20. The memory device of claim 17, wherein the stack comprises a first deck and a second deck vertically separated from the first deck by an insulative material, each of the first support structures and the second support structures individually comprising a continuous portion of a silicon oxide material extending substantially entirely through a height of the first deck and the second deck.

21. The memory device of claim 17, wherein a height of each of the second support structures is substantially the same as a height of individual pillars of the strings of memory cells.

22. The memory device of claim 17, wherein each of the second support structures are spaced apart from the first support structures in at least one horizontal direction, the second support structures located at opposing horizontal ends of rows of the conductive contacts without being horizontally aligned with the first support structures.

23. The memory device of claim 17, wherein at least some of the conductive materials of the stack are configured as select gate structures, a pattern of the conductive contacts connected to the select gate structures differing from a pattern of additional conductive contacts connected to lower portions of the conductive materials of the stack.

24. A system, comprising:
a processor operably coupled to an input device and an output device; and
one or more electronic devices operably coupled to the processor, the one or more electronic devices comprising:
a stack comprising tiers of alternating conductive structures and insulating structures;
stadium structures within the stack and comprising opposing stair step structures each individually including steps defined by edges of the tiers;
contact structures on the steps of the opposing stair step structures;
slots extending through the stack; and
support structures between the slots and the contact structures and extending vertically through the stack, the support structures exhibiting oblong cross-sectional shapes horizontally aligned with the conductive structures without being located between neighboring conductive contacts.

* * * * *